(12) United States Patent
Mitani et al.

(10) Patent No.: US 8,723,862 B2
(45) Date of Patent: May 13, 2014

(54) INFORMATION PROCESSOR AND INFORMATION PROCESSING METHOD

(75) Inventors: Yuka Mitani, Tokyo (JP); Kenji Iriguchi, Tokyo (JP); Susumu Matsubara, Tokyo (JP); Takashi Iwasaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 1085 days.

(21) Appl. No.: 12/668,380

(22) PCT Filed: Jul. 11, 2007

(86) PCT No.: PCT/JP2007/063835
§ 371 (c)(1),
(2), (4) Date: Feb. 24, 2010

(87) PCT Pub. No.: WO2009/008072
PCT Pub. Date: Jan. 15, 2009

(65) Prior Publication Data
US 2010/0182312 A1      Jul. 22, 2010

(51) Int. Cl.
*G06T 15/00* (2011.01)
(52) U.S. Cl.
USPC .......................................................... 345/419
(58) Field of Classification Search
CPC .................................. G06T 7/60; G06F 17/50
USPC ........................................................ 345/419
See application file for complete search history.

(56) References Cited

U.S. PATENT DOCUMENTS

| | | | |
|---|---|---|---|
| 4,945,498 A | 7/1990 | Mitamura | |
| 5,115,400 A * | 5/1992 | Watanabe et al. | ............. 700/182 |
| 5,701,403 A | 12/1997 | Watanabe et al. | |
| 5,999,186 A | 12/1999 | Jackson | |
| 6,256,595 B1 | 7/2001 | Schwalb et al. | |
| 2006/0129574 A1 | 6/2006 | Shin et al. | |

FOREIGN PATENT DOCUMENTS

| | | |
|---|---|---|
| CN | 1292130 A | 4/2001 |
| JP | 05-134729 A | 6/1993 |
| JP | 07-129630 A | 5/1995 |

(Continued)

OTHER PUBLICATIONS

Supplemental European Search Report corresponding to European Patent No. EP 07 79 6639 dated Sep. 9, 2010.

(Continued)

*Primary Examiner* — Maurice L. McDowell
*Assistant Examiner* — Kyle Zhai
(74) *Attorney, Agent, or Firm* — Sughrue Mion, PLLC; Richard C. Turner

(57) ABSTRACT

An information processor that calculates information concerning a three-dimensional shape comprises: a three-dimensional-shape input unit that inputs drawing data of a three-dimensional shape used for displaying a three-dimensional shape; a display unit that displays a three-dimensional shape of drawing data input to the three-dimensional-shape input unit; and a shape-value-information calculating unit that sets a shape element of a three-dimensional shape displayed on the display unit to data used for calculating a three-dimensional shape, based on an instruction input from outside, calculates a value of a shape concerning the three-dimensional shape not clearly shown within the drawing data as shape value information by using the set shape element, and displays a calculation result on the display unit.

10 Claims, 23 Drawing Sheets

(56) References Cited

FOREIGN PATENT DOCUMENTS

| | | |
|---|---|---|
| JP | 08-095626 A | 4/1996 |
| JP | 10-40405 A | 2/1998 |
| JP | 2001-142517 A | 5/2001 |
| JP | 2001-344288 A | 12/2001 |
| JP | 2003-044544 A | 2/2003 |
| JP | 2006-302125 A | 11/2006 |
| RU | 2192046 C1 | 10/2002 |
| WO | 9853429 A1 | 11/1998 |

OTHER PUBLICATIONS

Japanese Office Action, May 24, 2011, with partial English translation.
Russian Office Action, Apr. 15, 2011, with partial English translation.
Russian Decision of Patent Grant mailed Aug. 11, 2011 for counterpart Russian application 2010104671.

* cited by examiner

FIG.10

COORDINATE MEASUREMENT — 211b

MEASUREMENT COORDINATE SYSTEM

TOOL DIRECTION
B: 90.0000  C: 0.0000

MEASUREMENT ORIGIN
X: 98.3789  Y: 0.0000  Z: 120.0100

FEATURE POINT COORDINATES  ● DIAMETER / ○ RADIUS

| TYPE | X DIFFERENCE OF X | Y DIFFERENCE OF Y | Z DIFFERENCE OF Z | |
|---|---|---|---|---|
| 1 | 98.3789 | -27.3410 | 249.9900 | |
| 2 | 0.0000 | 38.9100 | 50.0000 | |
|   | -98.3783 | 63.3310 | -196.9300 | |
| 3 | 0.0000 | 0.0000 | 0.0000 | 39.9900 |
|   | 0.0000 | -39.3900 | -50.0000 | |

FIG.11

ANGLE MEASUREMENT — 211c

MEASUREMENT COORDINATE SYSTEM

TOOL DIRECTION
B: 90.0000  C: 0.0000

MEASUREMENT ORIGIN
X: 98.3789  Y: 0.0000  Z: 120.0100

ANGLE
1: 0.0000
2: 37.0000
3: 53.0000

FIG.32
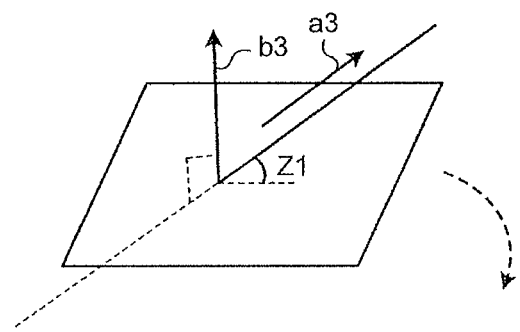
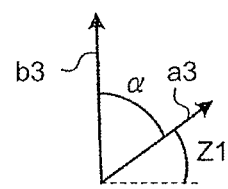
FIG.33
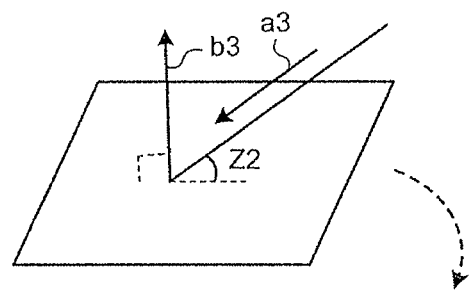
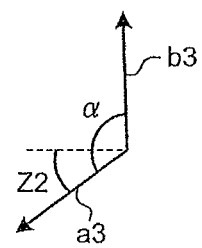

INFORMATION PROCESSOR AND INFORMATION PROCESSING METHOD

CROSS REFERENCE TO RELATED APPLICATIONS

This application is a National Stage of International Application No. PCT/JP2007/063835 filed Jul. 11, 2007, the contents of all of which are incorporated herein by reference in their entirety.

TECHNICAL FIELD

The present invention relates to an information processor and an information processing method for calculating information concerning a three-dimensional shape.

BACKGROUND ART

Machining tools and robots that machine a workpiece into various shapes process the workpiece three dimensionally while being controlled by a numerical control device (hereinafter, "NC device").

A mold-process support device described in Patent Document 1 includes a function (a dimension display function) of displaying, along with a three-dimensional model of a mold, a numerical value expressing a dimension of a desired portion present within a virtual space of the mold when the mold is designed as a three-dimensional model. In three-dimensionally displaying a virtual model created by CAD or the like, the dimension display function displays a dimension of a portion to be specifically focused in a subsequent operation. For example, the dimension display function displays a dialog box, and displays in numerical characters a distance and an angle designated by a mouse on a display time screen of the three-dimensional model.

A dimension display system described in Patent Document 2 displays two-dimensional drawings including a front view, a plan view, and a side view on a screen of a CAD/CAM system, and also displays a three-dimensional image of a product by opening a three-dimensional display window on the screen. The dimension display system displays a dimension between two points, angles and dimensions of crossed lines and surfaces, and a radius dimension of a circle.

Patent Document 1: Japanese Patent Application Laid-open No. 2003-44544 (Page 5, FIG. 4)
Patent Document 2: Japanese Patent Application Laid-open No. H5-134729 (Page 1)

DISCLOSURE OF INVENTION

Problem to be Solved by the Invention

However, according to the former conventional technique described above, it is necessary to store information concerning a portion of a virtual model of a mold digitally created in a computer in advance. Therefore, when an operator selects a portion other than stored information, the selected information cannot be displayed.

According to the latter conventional technique described above, dimension information is displayed after the information is acquired from two-dimensional drawings. Therefore, displayable dimension information is limited to information that can be analyzed from the two-dimensional drawings.

The present invention has been achieved in view of the above problems, and an object of the invention is to obtain an information processor and an information processing method capable of easily calculating information concerning a desired three-dimensional shape from drawing data of a three-dimensional shape.

Means for Solving Problem

In order to solve the aforementioned problems, an information processor that calculates information concerning a three-dimensional shape, comprises: a three-dimensional-shape input unit that inputs drawing data of a three-dimensional shape used for displaying a three-dimensional shape; a display unit that displays a three-dimensional shape of drawing data input to the three-dimensional-shape input unit; and a shape-value-information calculating unit that sets a shape element corresponding to an instruction input from outside among shape elements of a three-dimensional shape displayed on the display unit to data used for calculating a three-dimensional shape, calculates a dimension within the three-dimensional shape as shape value information by using a set shape element, and displays a calculation result on the display unit, wherein the instruction input from outside is an instruction to designate two different shape elements for which a dimension between shape elements is not clearly shown within the drawing data, and the shape-value-information calculating unit calculates shape value information by calculating a dimension between the two different shape elements.

Effect of the Invention

Because the instruction input from outside is the instruction that designates two different shape elements and because shape value information not clearly shown within the drawing data is calculated by calculating a dimension between two different shape elements, information concerning a desired three-dimensional shape can be easily calculated from the drawing data.

BRIEF DESCRIPTION OF DRAWINGS

FIG. 10 is a display example of coordinate values of a point.

FIG. 11 is a display example of values of an angle dimension.

FIG. 32 depicts an angle formed by a direction vector of a straight-line edge and a normal line vector of a plane.

FIG. 33 depicts an angle formed by a direction vector of a straight-line edge and a normal line vector of a plane.

EXPLANATIONS OF LETTERS OR NUMERALS

Figure 1:
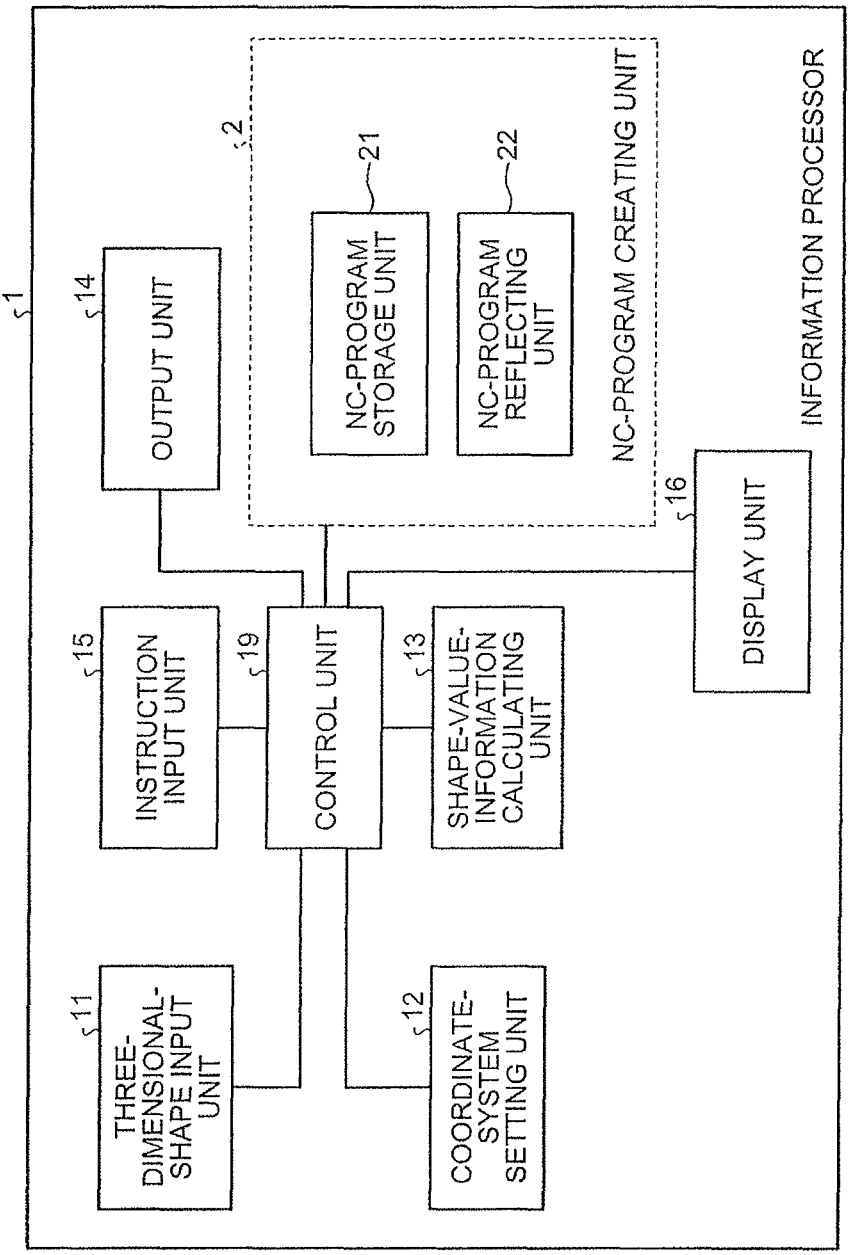
FIG. 1 is a block diagram of a configuration of an information processor according to an embodiment of the present invention.

1 Information processor
2 NC Program creating unit
11 Three-Dimensional-shape input unit
12 Coordinate-system setting unit
13 Shape-value-information calculating unit
14 Output unit
15 Instruction input unit
16 Display unit
19 Control unit
21 NC-program storage unit
22 NC-program reflecting unit
112E, 122E, 123E, 132E, 173 Edge
113P, 114P, 143, 144 Ending point
115, 124, 125, 171, 174, 176, 177 Point
126 Line
133F, 175 Surface
134 Angle
140, 150, 160 Three-dimensional display screen
142 Three-dimensional shape
145 Center point
201, 203, 204 Setting dialog
211a to 211c, 221a to 221c, 230 Shape-value information dialog
222 to 226, 231, 304 Shape value information
301, 303 NC Program editor screen
302 Cursor
a1 to a3 Direction vector
b1 to b3 Normal line vector
X, Y, Z1, Z2 Angle

BEST MODE(S) FOR CARRYING OUT THE INVENTION

Exemplary embodiments of an information processor and an information processing method according to the present invention will be explained below in detail with reference to the accompanying drawings. The present invention is not limited to the embodiments.

Embodiment

FIG. 1 is a block diagram of a configuration of an information processor according to an embodiment of the present invention. An information processor 1 is a device such as a computer that calculates information of a shape (a length dimension and an angle dimension of a portion contained in a shape) of a desired shape element based on information concerning a three-dimensional shape, and displays a calculation result.

The information processor 1 calculates information (shape value information described later) of a dimension or the like of a shape (a portion) based on information (drawing data containing a predetermined dimension such as CAD data) concerning a three-dimensional shape created by a CAD (Computer Aided Design) device, and reflects calculated shape value information (values of a shape not clearly identified in the CAD data) to an NC program or the like according to need. The information processor 1 can be caused to control a machining tool and a robot by using an NC program. In this case, the information processor 1 operates as an NC device.

The information processor 1 includes a three-dimensional-shape input unit 11, a coordinate-system setting unit 12, a shape-value-information calculating unit 13, an output unit 14, an instruction input unit 15, a display unit 16, an NC-program creating unit 2, and a control unit 19.

The three-dimensional-shape input unit 11 inputs information (information to display a side and a surface) concerning a three-dimensional shape transmitted from an external device (hereinafter, "three-dimensional shape information"), and transmits the input information to the coordinate-system setting unit 12, the shape-value-information calculating unit 13, and the display unit 16.

The instruction input unit 15 includes a mouse and a keyboard, and inputs an instruction input by a user (an operator such as a process operator) of the information processor 1. The instruction input unit 15 is input with information (information for designating a coordinate system) of a coordinate system set to a shape contained in three-dimensional shape information, and information designating a shape element (such as a point, a line, and a surface) within a three-dimensional shape displayed on the display unit 16. The instruction input unit 15 inputs information of an input coordinate system to the coordinate-system setting unit 12, and inputs information of an input shape element to the shape-value-information calculating unit 13.

The coordinate-system setting unit 12 sets a new coordinate system to be used for calculating or displaying shape value information, to CAD data (three-dimensional data) created by the CAD coordinate system, and converts the CAD data into information of a three-dimensional shape corresponding to the new coordinate system. The coordinate-system setting unit 12 sets a new coordinate system based on instruction information (information for specifying a coordinate system) input from the instruction input unit 15, to CAD data of a three-dimensional shape displayed on the display unit 16. The coordinate-system setting unit 12 transmits a set new coordinate system and information of a three-dimensional shape of which coordinate system is converted, to the shape-value-information calculating unit 13, the display unit 16, the NC-program creating unit 2, and the output unit 14. When a CAD coordinate system is the same as a new coordinate system to be used for calculating or displaying shape value information, the coordinate-system setting unit 12 does not need to convert a coordinate system of CAD data.

The shape-value-information calculating unit 13 calculates as shape value information, information (information using a shape element) (for example, a value of a length dimension and an angle dimension of a portion) of an optional shape designated by a user in a three-dimensional shape displayed on the display unit 16. The shape-value-information calculating unit 13 calculates shape value information based on instruction information (information for designating a shape element) input from the instruction input unit 15. The shape-value-information calculating unit 13 transmits a calculated result (shape value information) to the display unit 16, the NC-program creating unit 2, and the output unit 14.

The NC-program creating unit 2 creates or corrects an NC program. The NC-program creating unit 2 includes an NC-program storage unit 21, and an NC-program reflecting unit 22. The NC-program storage unit 21 is a memory that stores an NC program used for controlling a machining tool. The NC-program reflecting unit 22 reflects shape value information to an NC program within the NC-program storage unit 21, and stores a reflected new NC program into the NC-program storage unit 21.

The display unit 16 includes a display unit such as a liquid crystal display. The display unit displays a three-dimensional shape corresponding to three-dimensional shape information, a coordinate system set by the coordinate-system setting unit 12, a three-dimensional shape in the coordinate system, a portion (a shape element of a workpiece) designated by a user, a shape (a portion of a line and an angle) to be calculated, a setting dialog to cause the user to set a shape to be calculated, shape value information, and a reflected new NC program.

The output unit 14 outputs various information displayed on the display unit 16 to an external device. The output unit 14 outputs a three-dimensional shape in a coordinate system set by the coordinate-system setting unit 12, a portion designated by a user, shape value information, and a reflected new NC program to an external device. The control unit 19 controls the three-dimensional-shape input unit 11, the coordinate-system setting unit 12, the shape-value-information calculating unit 13, the output unit 14, the instruction input unit 15, the display unit 16, and the NC-program creating unit 2.

Figure 2:
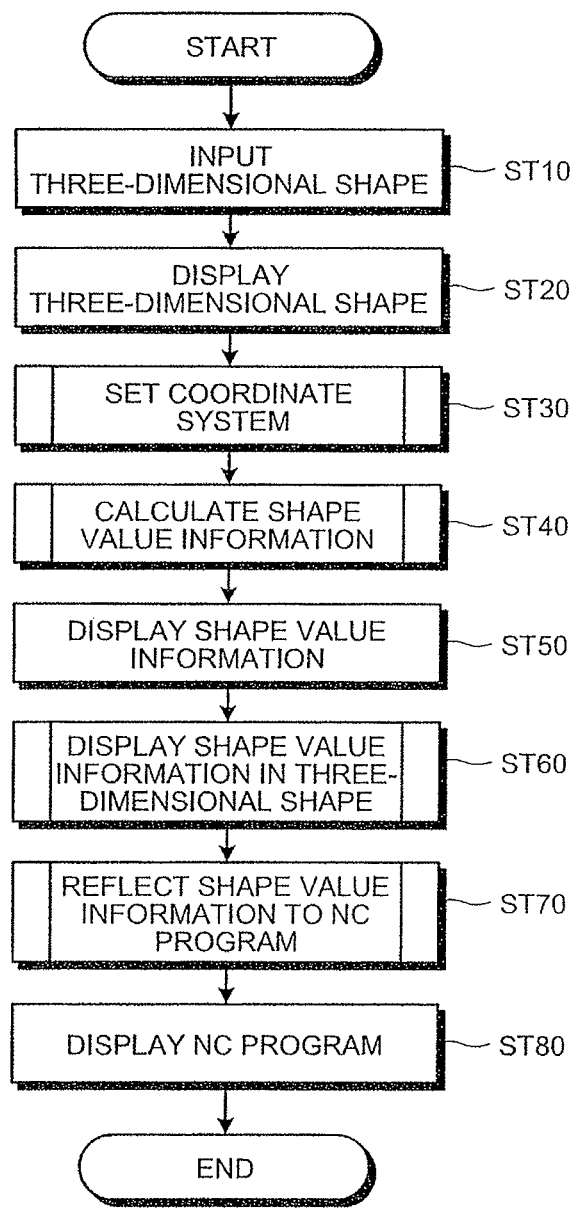
FIG. 2 is a flowchart of an operation procedure of the information processor.

An operation procedure of the information processor 1 is explained next. FIG. 2 is a flowchart of the operation procedure of the information processor. The three-dimensional-shape input unit 11 inputs three-dimensional shape information (geographic information) transmitted from an external device (Step ST10), and transmits the input three-dimensional shape information to the display unit 16 and the coordinate-system setting unit 12. The display unit 16 displays a three-dimensional shape corresponding to the three-dimensional shape information from the three-dimensional-shape input unit 11 (Step ST20).

The coordinate-system setting unit 12 sets (a converting process of a coordinate system) a new coordinate system (a coordinate axis and an origin) to CAD data (three-dimensional shape data) created by the CAD coordinate system, based on instruction information (information for designating a coordinate system) from a user input from the instruction input unit 15, and converts the input three-dimensional shape information into information of a three-dimensional shape corresponding to the coordinate system (Step ST30). The coordinate-system setting unit 12 causes the display unit 16 to display the set coordinate system and the information of the three-dimensional shape converted corresponding to the coordinate system, and also transmits these pieces of information to the shape-value-information calculating unit 13.

The shape-value-information calculating unit 13 calculates shape value information based on the instruction information (information for designating a shape element) from a user input from the instruction input unit 15 (Step ST40). The shape-value-information calculating unit 13 transmits the shape value information to the display unit 16 and the NC-program creating unit 2.

The display unit 16 displays the shape value information from the shape-value-information calculating unit 13, in a coordinate system designated by an NC program (Step ST50). In a machining process or the like, a display format of a process position set in a program is different depending on a processing method. For example, there are a method of displaying a processing position by using coordinate values of an orthogonal coordinate system, and a method of displaying a processing position by using a coordinate values of a polar coordinate system. The display unit 16 displays a portion (a portion that has become a calculation target) of a three-dimensional shape concerning shape value information displayed in a tabular form or the like, in a newly set coordinate system (Step ST60).

The NC-program creating unit 2 edits an NC program within the NC-program storage unit 21 by reflecting shape value information from the shape-value-information calculating unit 13 to the NC program (Step ST70). When instruction information to designate a coordinate system is input from a user, the display unit 16 converts shape value information into a value corresponding to the designated coordinate system, and displays the converted shape value information. The display unit 16 displays the NC program (an edited result) created by the NC-program creating unit (Step ST80).

While performing a process (a calculation process of shape value information) at Step ST40 after a process (a setting process of a new coordinate system) at Step ST30 is explained in FIG. 2, the coordinate-system setting unit 12 can perform the process of Step S30 after the process of Step S40 by the shape-value-information calculating unit 13. In this case, the coordinate-system setting unit 12 converts the shape value information obtained in the process of Step ST40 into a value corresponding to the coordinate system set in the process of Step ST30.

Each process (Steps ST30 to ST70) shown in FIG. 2 is explained in detail next. A process (a setting process of a coordinate system) at Step ST30, a process (a calculation process of shape value information) at Step ST40, a process (a display process of shape value information) at Step ST60, and a process (a reflecting process to an NC program) at Step ST70 are explained in this order, and a calculation process of shape value information is lastly explained in detail.

Figure 3:
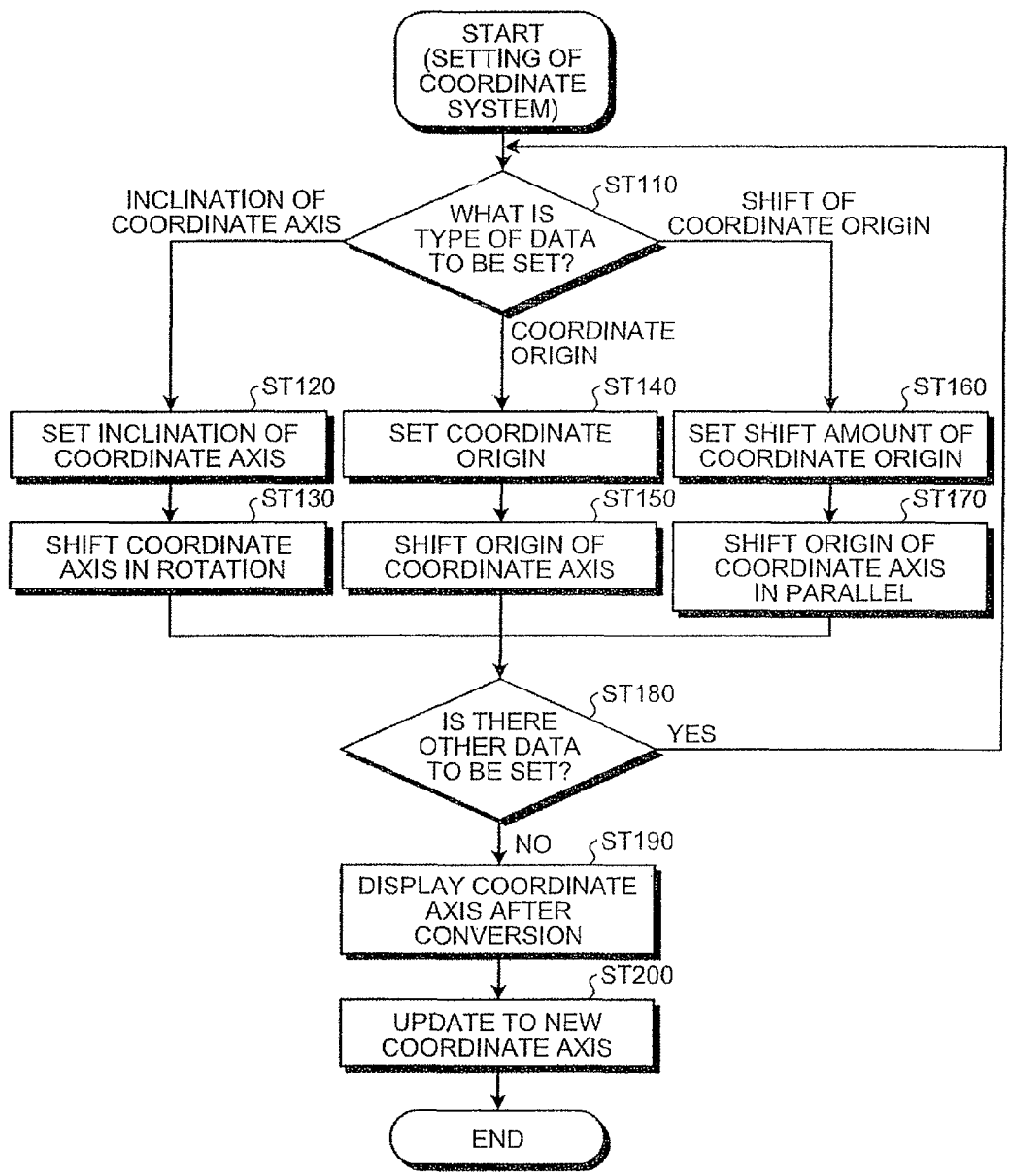
FIG. 3 is a flowchart of a setting process procedure of a coordinate system.

FIG. 3 is a flowchart of a setting process procedure of a coordinate system. The coordinate-system setting unit 12 determines which type of data in a coordinate system is to be set based on instruction information input from the instruction input unit 15 (Step ST110). Data to be set as a coordinate system (a coordinate system newly set to CAD data created in the CAD coordinate system) includes an inclination of a coordinate axis, a coordinate origin, and a shift of a coordinate origin. In the present embodiment, a new coordinate system set by the coordinate-system setting unit 12 becomes a coordinate system to be used for calculating or displaying shape value information.

When instruction information for designating an inclination angle of a coordinate axis is input from the instruction input unit 15 (Step ST110; inclination of coordinate system), the coordinate-system setting unit 12 determines that content of data concerning the coordinate system is an inclination of a coordinate axis. The coordinate-system setting unit 12 rotationally transfers (inclines) a coordinate axis of three-dimensional shape data by the designated inclination angle based on the instruction information from the instruction input unit 15 (Steps ST120 and ST130), thereby converting three-dimensional shape data of the current coordinate system.

When instruction information for designating a coordinate origin is input from the instruction input unit 15 (Step ST110; coordinate origin), the coordinate-system setting unit 12 determines that content of data concerning the coordinate system is setting (designation of a new coordinate origin) of a coordinate origin. The coordinate-system setting unit 12 shifts in parallel the coordinate axis to a designated coordinate origin based on the instruction information from the instruction input unit 15 (Steps ST140 and ST150), thereby converting three-dimensional shape data of the current coordinate system.

When instruction information for designating a shift amount of a coordinate origin is input from the instruction input unit 15 (Step ST110; shift of a coordinate origin), the coordinate-system setting unit 12 determines that content of data concerning the coordinate system is shift (designation of a shift amount) of a coordinate origin. The coordinate-system setting unit 12 shifts in parallel the coordinate axis to a designated coordinate origin based on the instruction information from the instruction input unit 15 (Steps ST160 and ST170), thereby converting three-dimensional shape data of the current coordinate system.

After converting three-dimensional shape data of the current coordinate system, the coordinate-system setting unit 12 determines whether other data to be set as a coordinate system is present (Step ST180). When other data to be set as a coordinate system is present (YES at Step ST180), the coordinate-system setting unit 12 repeats the process of Steps ST110 to ST170. That is, the coordinate-system setting unit 12 determines which data of a coordinate system is to be set based on the instruction information input from the instruction input unit 15, and sets a coordinate system corresponding to a result of this determination.

When there is no other data to be set as a coordinate system (NO at Step ST180), the coordinate-system setting unit 12 causes the display unit 16 to display three-dimensional shape data and a coordinate axis of a converted coordinate system (Step ST190). Further, the coordinate-system setting unit 12 updates a converted coordinate axis to a new current coordinate axis (Step ST200).

In the present embodiment, while presence of three types of data is explained as an example of data to be set as a coordinate system, data to be set as a coordinate system can be any data as far as the data is related to a coordinate system. The coordinate-system setting unit 12 can set data to be set as a coordinate system one by one, or can set plural data simultaneously. When a coordinate system is set at plural times, three-dimensional shape data and a coordinate axis in a converted coordinate system can be displayed on the display unit 16 each time when a coordinate system is set.

Figure 4:
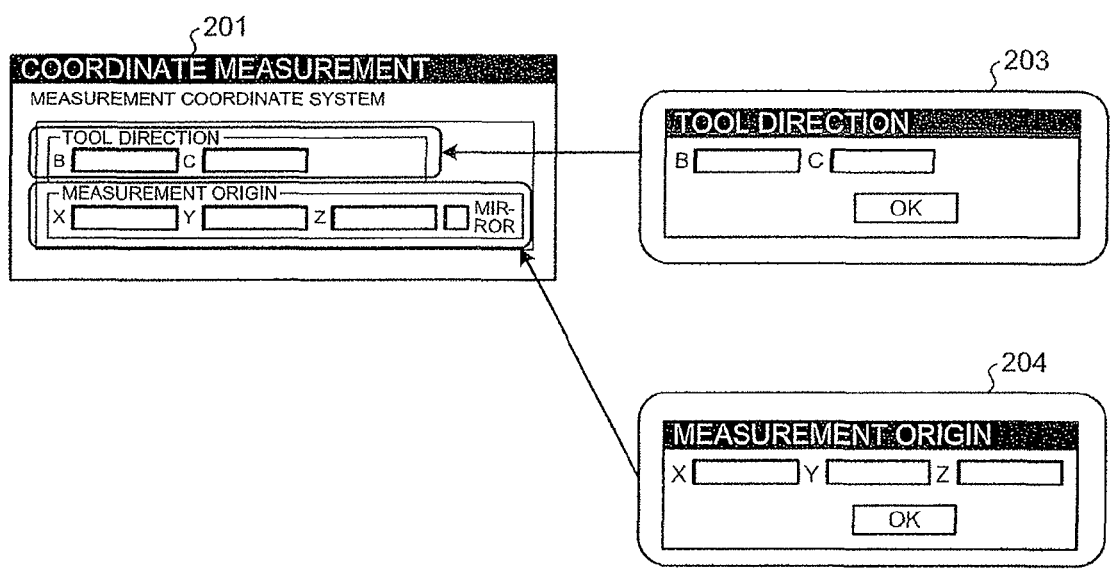
FIG. 4 is an explanatory diagram of a setting dialog to be displayed in setting a coordinate system.

FIG. 4 is an explanatory diagram of a setting dialog to be displayed in setting a coordinate system. FIG. 4 depicts a setting dialog 201 to measure coordinates of a point (coordinate values), and setting dialogs 203 and 204 to set a coordinate system (a measurement coordinate system) used for measuring coordinates of a point.

In the setting dialog 201, there are provided a column (a text box) into which a coordinate system in measuring a point is input, a column into which the type (a feature point described later) of a point to be calculated is input, and a button to refer to information of a coordinate system held by process unit data (three-dimensional shape data).

A coordinate system to measure a point is set by an inclination of a coordinate axis and a coordinate origin. The setting dialog 203 is a dialog that sets an inclination of a coordinate axis, and FIG. 4 is an example of a setting dialog in setting an inclination of a coordinate axis from a proceeding direction of a tool.

The setting dialog 204 is a dialog that sets a coordinate origin, and FIG. 4 is an example of a setting dialog in inputting coordinate values. An inclination of a coordinate axis set by the setting dialog 203 and a coordinate origin set by the setting dialog 204 are reflected to a column into which a coordinate system of the setting dialog 201 is input.

Figure 5:
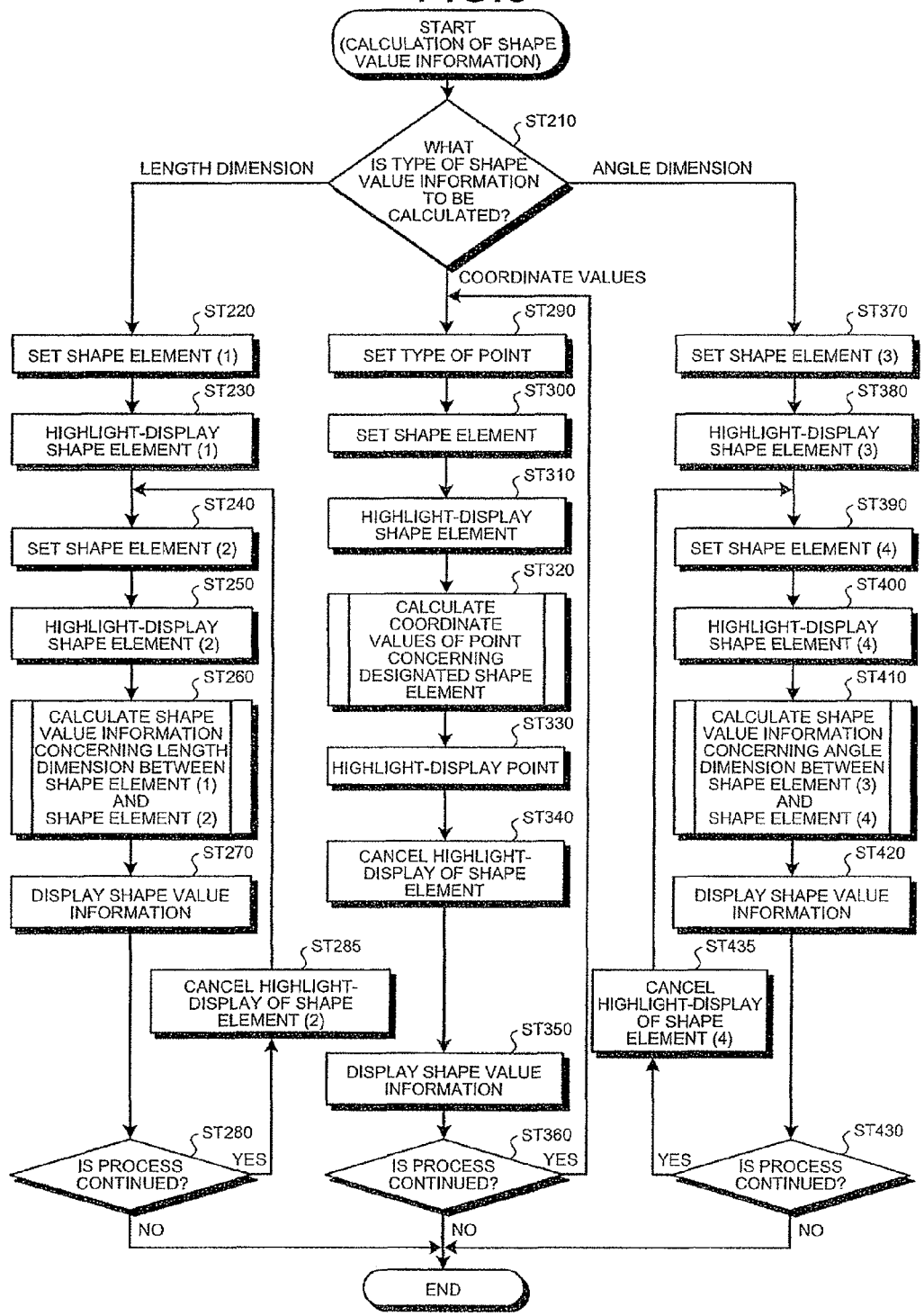
FIG. 5 is a flowchart of a calculation process procedure of shape value information.

A process (a calculation process of shape value information) at Step ST40 is explained next. FIG. 5 is a flowchart of a calculation process procedure of shape value information. The shape-value-information calculating unit 13 determines the type (hereinafter, "calculation type") of a shape (a portion) to be calculated based on instruction information input from the instruction input unit 15 (Step ST210). A calculation type includes a length dimension (a distance), coordinate values, and an angle dimension. The length dimension includes a radius dimension, a diameter dimension, an arc dimension, and an inter-shape-element length dimension.

(When Calculation Type is Length Dimension)

An example of designating one shape element (1) that becomes a reference, and sequentially calculating (measuring) a distance between the shape element (1) and each shape element (2) is explained. When a calculation type determined by the shape-value-information calculating unit 13 is a length dimension (Step ST210; length dimension), a user designates a first shape element (1) and a second shape element (2) on a display screen of a three-dimensional shape as user-desired shape elements (shape elements of a portion of which dimension is to be measured). A user designates the first shape element (1) and the second shape element (2) from the instruction input unit 15 (such as a mouse). The first shape element (1) is a shape element that becomes a reference of calculating a length dimension.

The first shape element (1) is transmitted from the instruction input unit 15 to the shape-value-information calculating unit 13. The shape-value-information calculating unit 13 sets the designated shape element (1) onto a display screen of a three-dimensional shape (Step ST220). Specifically, the shape-value-information calculating unit 13 extracts in advance data corresponding to the designated shape element (1) from a three-dimensional shape displayed on the display unit 16. The shape-value-information calculating unit 13 highlight-displays on the display unit 16 a portion of the designated shape element (1) from the three-dimensional shape displayed on the display unit 16 (Step ST230).

The second shape element (2) is transmitted from the instruction input unit 15 to the shape-value-information calculating unit 13. The shape-value-information calculating unit 13 sets the designated shape element (2) onto a display screen of a three-dimensional shape (Step ST240). Specifically, the shape-value-information calculating unit 13 extracts in advance data corresponding to the designated shape element (2) from a three-dimensional shape displayed on the display unit 16. The shape-value-information calculating unit 13 highlight-displays on the display unit 16 a portion of the designated shape element (2) from the three-dimensional shape displayed on the display unit 16 (Step ST250).

The shape-value-information calculating unit 13 calculates by internal calculation shape value information concerning a length dimension between the shape element (1) and the shape element (2) (Step ST260). The shape-value-information calculating unit 13 calculates as shape value information a differential value of a coordinate component between points (between points) to be measured and a distance between points present within the same plane or space. The shape-value-information calculating unit 13 displays calculated shape value information on the display unit 16 as a dialog (shape-value information dialog) (Step ST270).

Thereafter, when the information processor 1 is to continue a calculation process of a length dimension, a user inputs from the instruction input unit 15 instruction information indicating that the calculation process of a length dimension is to be continued. The instruction information is transmitted from the instruction input unit 15 to the shape-value-information calculating unit 13.

The shape-value-information calculating unit 13 determines whether to continue the calculation process of a length dimension based on the instruction information from the instruction input unit 15 (Step ST280). When the shape-value-information calculating unit 13 determines to continue the calculation process of a length dimension (YES at Step ST280), the shape-value-information calculating unit 13 causes the display unit 16 to cancel highlight-display of the shape element (2) which is not the reference of calculating a length dimension (Step ST285).

The shape-value-information calculating unit 13 performs the process of Steps ST240 to ST285. When the calculation process of a length dimension is to be continued, a user inputs a new shape element (2) from the instruction input unit 15. The new shape element (2) is transmitted from the instruction input unit 15 to the shape-value-information calculating unit 13.

The shape-value-information calculating unit 13 sets the newly designated shape element (2) onto a display screen of a three-dimensional shape, and highlight-displays a portion of the designated new shape element (2) on the display unit 16 (Steps ST240 and ST250).

The shape-value-information calculating unit 13 calculates by internal calculation shape value information concerning a length dimension between the shape element (1) and the shape element (2), and causes the display unit 16 to display the calculated shape value information as a shape-value information dialog (Steps ST260 and ST270).

The shape-value-information calculating unit 13 repeats the process of Steps ST240 to ST285 until when a user inputs instruction information (an instruction of calculation end) indicating not to continue the calculation process of a length dimension to the instruction input unit 15. When the user inputs the instruction of calculation end to the instruction input unit 15 (NO at Step ST280), the information processor 1 ends the calculation process of a length dimension.

(When Calculation Type is Coordinate Values)

When a calculation type determined by the shape-value-information calculating unit 13 is coordinate values (Step ST210; coordinate values), a user designates the type (for example, an ending point, an intermediate point, a center point) of a point of which coordinate values are to be obtained as the type of a portion of which dimension is desired to be measured. A user designates a shape element (a position) of a portion of which dimension is desired to be measured, on a display screen of a three-dimensional shape.

A user designates from the instruction input unit 15 (such as a mouse) the type of a point and a shape element designated by the user and to be calculated, and transmits these pieces of information from the instruction input unit 15 to the shape-value-information calculating unit 13. The shape-value-information calculating unit 13 stores (sets) the designated type of a point (Step ST290). The shape-value-information calculating unit 13 also sets the designated shape element onto a display screen of a three-dimensional shape (Step ST300). Specifically, the shape-value-information calculating unit 13 extracts data corresponding to the designated shape element in advance.

The shape-value-information calculating unit 13 causes the display unit 16 to highlight-display the designated shape element from the three-dimensional shape displayed on the display unit 16 (Step ST310). The shape-value-information calculating unit 13 calculates by internal calculation shape value information (coordinate values of a point) of the designated type of a point, which is also the shape value information relevant to the designated shape element (Step ST320).

The shape-value-information calculating unit 13 causes the display unit 16 to highlight-display a position (a point) corresponding to coordinate values (shape value information) of the calculated point, on a display screen of a three-dimensional shape (Step ST330). After the calculated point is highlight-displayed, the shape-value-information calculating unit 13 causes the display unit 16 to cancel the highlight-display of a shape element (Step ST340). The shape-value-information calculating unit 13 causes the display unit 16 to display the calculated shape value information as a dialog (a shape-value information dialog) (Step ST350).

Thereafter, to cause the information processor 1 to continue the calculation process of coordinate values, a user inputs from the instruction input unit 15 instruction information indicating to continue the calculation process of coordinate values. The instruction information is transmitted from the instruction input unit 15 to the shape-value-information calculating unit 13.

The shape-value-information calculating unit 13 determines whether to continue the calculation process of coordinate values, based on the instruction information from the instruction input unit 15 (Step ST360). When it is determined to continue the calculation process of coordinate values (YES at Step ST360), the shape-value-information calculating unit 13 performs the process of Steps ST290 to ST360. To continue the calculation process of coordinate values, a user inputs the type of a new point and a new shape element from the instruction input unit 15. The type of the new point and the new shape element are transmitted from the instruction input unit 15 to the shape-value-information calculating unit 13.

The shape-value-information calculating unit 13 stores the designated type of the point, and sets the designated shape element onto a display screen of a three-dimensional shape (Steps ST290 and ST300). The shape-value-information calculating unit 13 causes the display unit 16 to highlight-display the designated shape element (Step ST310).

The shape-value-information calculating unit 13 calculates shape value information of the designated type of a point, which is also the shape value information relevant to the designated shape element (Step ST320). The shape-value-information calculating unit 13 causes the display unit 16 to highlight-display a point corresponding to coordinate values of the calculated point, on a display screen of a three-dimensional shape, and causes the display unit 16 to cancel highlight-display of a shape element (Steps ST330 and ST340). The shape-value-information calculating unit 13 causes the display unit 16 to display the calculated shape value information as a dialog (Step ST350).

The shape-value-information calculating unit 13 repeats the process of Steps ST290 to ST360 until when a user inputs to the instruction input unit 15 instruction information (an instruction of calculation end) indicating not to continue the calculation process of coordinate values. When the user inputs the instruction of calculation end to the instruction input unit 15 (NO at Step ST360), the information processor 1 ends the calculation process of coordinate values.

In FIG. 5, after the type of a point to be calculated is set, a shape element to be calculated is set and highlight-display is performed. Alternatively, the type of a point to be calculated can be set after a shape element to be calculated is set and after highlight-display is performed. In other words, it suffices to set the type of a point to be calculated before shape value information is calculated.

(When Calculation Type is Angle Dimension)

An example of designating one shape element (3) that becomes a reference, and sequentially calculating (measuring) an angle formed by the shape element (3) and each shape element (3) (4) is explained. When a calculation type determined by the shape-value-information calculating unit 13 is an angle dimension (Step ST210; angle dimension), a user designates a first shape element (3) and a second shape element (4) on a display screen of a three-dimensional shape as user-desired shape elements. A user designates the first shape element (3) and the second shape element (4) from the instruction input unit 15 (such as a mouse). The first shape element (3) is a shape element that becomes a reference of calculating an angle dimension.

The first shape element (3) is transmitted from the instruction input unit 15 to the shape-value-information calculating unit 13. The shape-value-information calculating unit 13 sets the designated shape element (3) onto a display screen of a three-dimensional shape (Step ST370). Specifically, the shape-value-information calculating unit 13 extracts in advance data corresponding to the designated shape element (3) from a three-dimensional shape displayed on the display unit 16. The shape-value-information calculating unit 13 causes the display unit 16 to highlight-display a portion of the designated shape element (3) from the three-dimensional shape displayed on the display unit 16 (Step ST380).

The second shape element (4) is transmitted from the instruction input unit 15 to the shape-value-information calculating unit 13. The shape-value-information calculating unit 13 sets the designated shape element (4) onto a display screen of a three-dimensional shape (Step ST390). Specifically, the shape-value-information calculating unit 13 extracts in advance data corresponding to the designated shape element (4) from a three-dimensional shape displayed on the display unit 16. The shape-value-information calculating unit 13 causes the display unit 16 to highlight-display a portion of the designated shape element (4) from the three-dimensional shape displayed on the display unit 16 (Step ST400).

The shape-value-information calculating unit 13 calculates by internal calculation shape value information concerning an angle dimension between the shape element (3) and the shape element (4) (Step ST410). The shape-value-information calculating unit 13 calculates as shape value information an angle formed by the shape element (3) and the shape element (4). The shape-value-information calculating unit 13 causes the display unit 16 to display calculated shape value information as a dialog (a shape-value information dialog) (Step ST420).

Thereafter, when the information processor 1 is to continue a calculation process of an angle dimension, a user inputs from the instruction input unit 15 instruction information to indicate that the calculation process of an angle dimension is to be continued. The instruction information is transmitted from the instruction input unit 15 to the shape-value-information calculating unit 13.

The shape-value-information calculating unit 13 determines whether to continue the calculation process of an angle dimension based on the instruction information from the instruction input unit 15 (Step ST430). When the shape-value-information calculating unit 13 determines to continue the calculation process of an angle dimension (YES at Step ST430), the shape-value-information calculating unit 13 causes the display unit 16 to cancel highlight-display of the shape element (4) which is not the reference of calculating an angle dimension (Step ST435).

The shape-value-information calculating unit 13 performs the process of Steps ST390 to ST435. When the calculation process of an angle dimension is to be continued, a user inputs a new shape element (4) from the instruction input unit 15. The new shape element (4) is transmitted from the instruction input unit 15 to the shape-value-information calculating unit 13.

The shape-value-information calculating unit 13 sets the newly designated shape element (4) onto a display screen of a three-dimensional shape, and causes the display unit 16 to highlight-display a portion of the designated new shape element (4) (Steps ST390 and ST400).

The shape-value-information calculating unit 13 calculates by internal calculation shape value information concerning an angle dimension between the shape element (3) and the shape element (4), and causes the display unit 16 to display the calculated shape value information as a shape-value information dialog (Steps ST410 and ST420).

The shape-value-information calculating unit 13 repeats the process of Steps ST390 to ST435 until when a user inputs to the instruction input unit 15 instruction information (an instruction of calculation end) indicating not to continue the calculation process of an angle dimension. When the user inputs the instruction of calculation end to the instruction input unit 15 (NO at Step ST430), the information processor 1 ends the calculation process of an angle dimension.

As described above, when a calculation target is a length dimension, a difference or a distance of coordinate components between two shape elements is calculated as shape value information. When calculation targets are coordinate values, coordinate values of a point concerning a designated shape element are calculated as shape value information. When calculation targets are coordinate values and also when a designated shape element concerns an arc edge, a diameter or a radius is calculated as shape value information. When a calculation target is an angle dimension, a size of an angle formed by two shape elements is calculated as shape value information.

Figure 6:
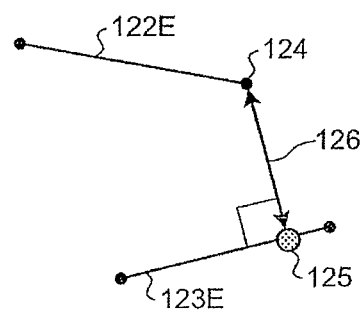
FIG. 6 is an explanatory diagram of a calculation process of a length dimension.

A calculation process of shape value information is explained with reference to FIGS. 6 to 8. The following edges show a line shape such as a curve, a straight line, and a line segment. FIG. 6 is an explanatory diagram of a calculation process of a length dimension. FIG. 6 is an example of calculating size dimension information (a length dimension) concerning two shape elements of an edge 122E and an edge 123E.

The shape-value-information calculating unit 13 first obtains a point 124 and a point 125 between which a distance between the edge 122E and the edge 123E becomes the shortest. The point 124 is a point on the edge 122E, and the point 125 is a point on the edge 123E.

After obtaining the point 124 and the point 125, the shape-value-information calculating unit 13 calculates shape value information (a length dimension) concerning a line 126 that becomes the shortest distance between the point 124 and the point 125. The shape-value-information calculating unit 13 causes the line 126 to be displayed on a three-dimensional shape on a display screen, and causes the shape value information concerning the line 126 to be displayed on the display screen (a shape-value information dialog).

In FIG. 6, a calculation process of a length dimension between two edges of the edge 122E and the edge 123E is explained. There are also various other combinations of shape elements that become calculation targets of dimension value information. For example, calculation targets of dimension value information include a length dimension between a point and a point, a length dimension between a point and an edge, a length dimension between a point and a surface, a length dimension between an edge and a surface, and a length dimension between a surface and a surface.

Figure 7:
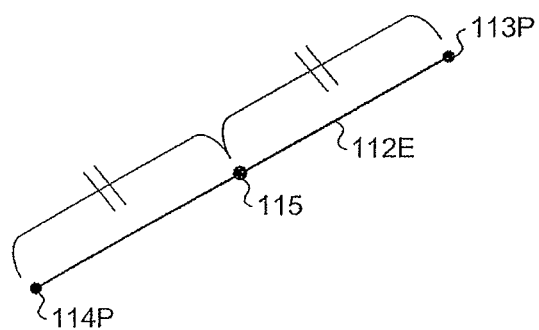
FIG. 7 is an explanatory diagram of a calculation process of coordinate values.

FIG. 7 is an explanatory diagram of a calculation process of coordinate values. FIG. 7 is an example of calculating coordinate value information of a point (an intermediate point on the edge 122E) concerning a shape element of the edge 122E.

The shape-value-information calculating unit 13 calculates as dimension value information a point 115 that becomes an intermediate position of ending points 113P and 114P of an edge 112E. The point 115 is a point on the edge 112E. The shape-value-information calculating unit 13 causes the calculated point 115 on a three-dimensional shape to be displayed on a display screen, and causes shape value information concerning the point 115 to be displayed on a display screen (a shape-value information dialog).

In FIG. 7, a calculation process of an intermediate point (coordinate values) on the edge 112E is explained. There are also various other shape elements (coordinate values) that becomes calculation targets of dimension value information. For example, calculation targets of dimension value information include coordinate values of an ending point and coordinate values of a center point.

Figure 8:
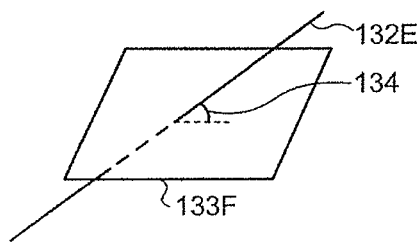
FIG. 8 is an explanatory diagram of a calculation process of an angle dimension.

FIG. 8 is an explanatory diagram of a calculation process of an angle dimension. FIG. 8 is an example of calculating dimension value information (an angle dimension) concerning two shape elements of an edge 132E and a surface 133F.

The shape-value-information calculating unit 13 calculates shape value information (an angle dimension) concerning an angle 134 formed by the edge 132E and the surface 133F. The shape-value-information calculating unit 13 causes the angle 134 on a three-dimensional shape to be displayed on a display screen, and causes shape value information concerning the angle 134 to be displayed on the display screen.

In FIG. 8, a calculation process of an angle dimension of an angle formed by the edge 132E and the surface 133F is explained. There are also various other combinations of shape elements that become calculation targets of shape value information. For example, calculation targets of shape value information include an angle dimension formed by an edge and an edge, an angle dimension formed by a surface and a surface, and an angle (an angle formed by a processing axis and a feature point described later) limited to a predetermined direction.

Figure 9:
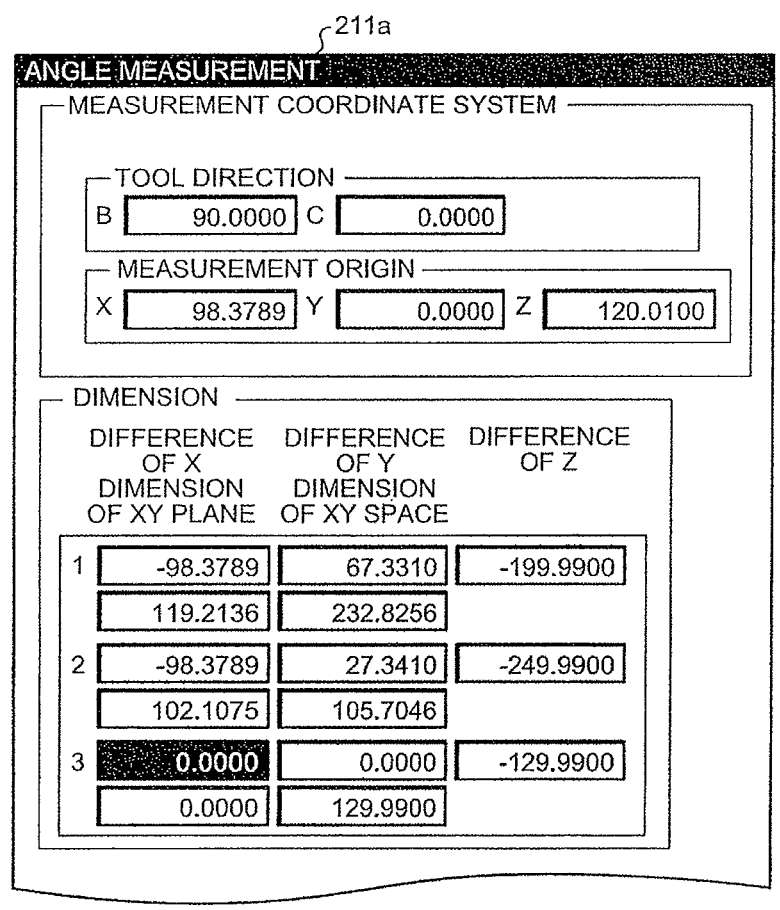
FIG. 9 is a display example of a length dimension values.

FIGS. 9 to 11 are display examples of shape value information. FIG. 9 depicts a shape-value information dialog 211a as a display example of a length dimension between two shape elements. FIG. 10 depicts a shape-value information dialog 211b as a display example of coordinate values of a point. FIG. 11 depicts a shape-value information dialog 211c as a display example of values of an angle dimension.

In the present embodiment, the shape-value information dialogs 211a to 211c display shape value information corresponding to a display format of an NC program. The shape-value information dialogs 211a to 211c display, for example, a coordinate system (such as an orthogonal coordinate system and a polar coordinate system) used in the NC program, coordinate values in the coordinate system, an inclination of a coordinate axis, and a coordinate origin.

Figure 12:
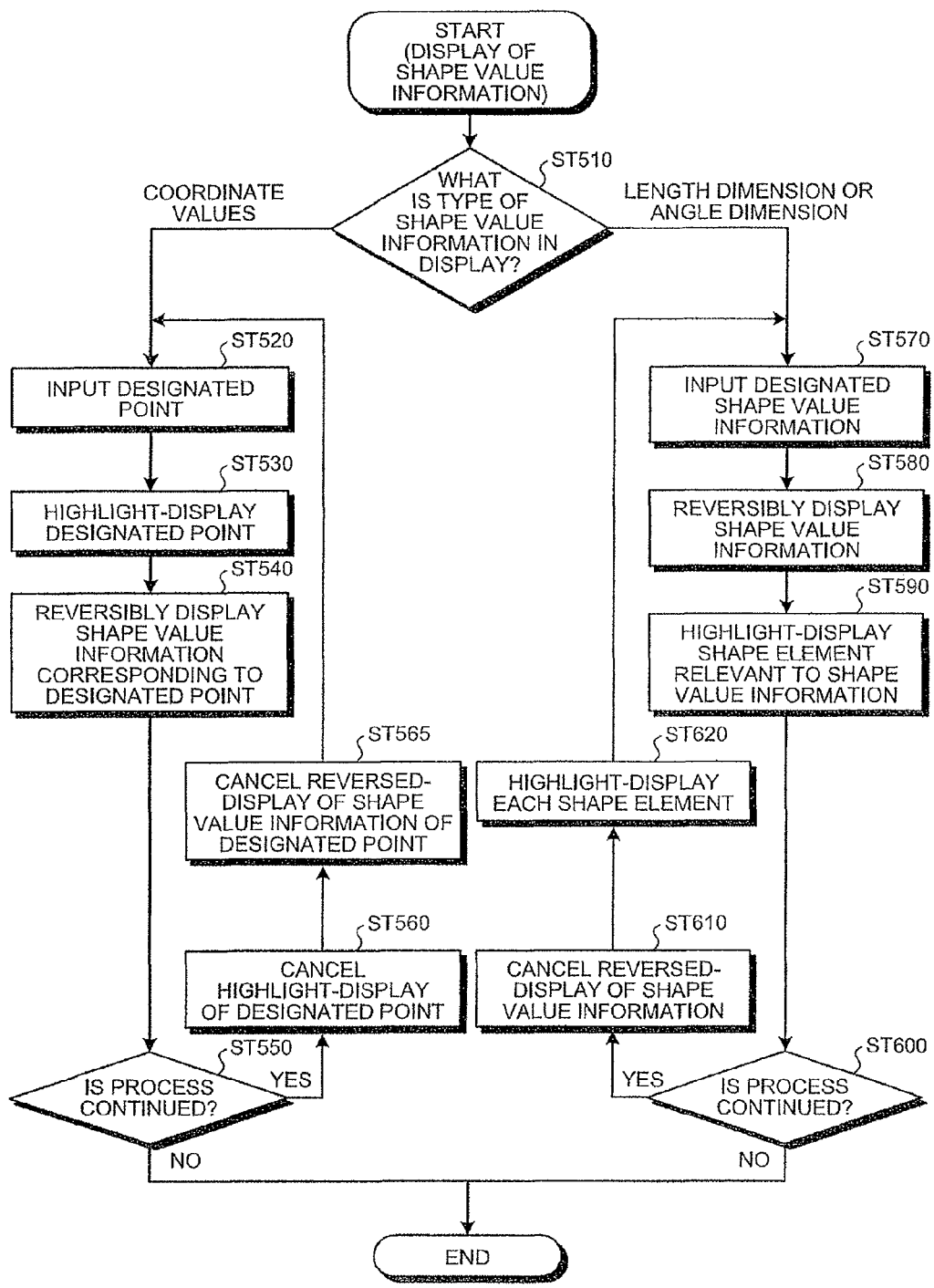
FIG. 12 is a flowchart of a display process procedure of shape value information.

A process (a display process of shape value information) at Step ST60 is explained next. FIG. 12 is a flowchart of a display process procedure of shape value information. In the present embodiment, based on instruction information that a user inputs to the instruction input unit 15, a shape element (a position on a three-dimensional shape) that becomes a confirmation target is highlight-displayed on a screen (a confirmation screen) to confirm shape value information, and shape value information corresponding to this shape element is reversibly displayed in a shape-value information dialog. The display unit 16 displays a display screen of a three-dimensional shape and a shape-value information dialog by linking them to each other.

The shape-value-information calculating unit 13 determines the type (hereinafter, "confirmation type") of a shape value of information based on shape value information (a shape element) of a three-dimensional shape displayed on the display unit 16 (Step ST510).

(When Confirmation Type is Coordinate Values)

When a confirmation type determined by the shape-value-information calculating unit 13 is coordinate values (Step ST510; coordinate values), each point (one to a plural number) corresponding to shape value information (coordinate values) displayed in a shape-value information dialog is highlight-displayed on a display screen of a three-dimensional shape.

When a user designates by the instruction input unit 15 (such as a mouse) one of points highlight-displayed on a screen of a three-dimensional shape, information of a designated point (a designated point) is input from the instruction input unit 15 to the shape-value-information calculating unit 13 (Step ST520). The shape-value-information calculating unit 13 causes the designated point to be displayed on the screen of a three-dimensional display (Step ST530), and cancels highlight-display of other points that have been highlight-displayed. The shape-value-information calculating unit 13 causes shape value information (a calculated value) concerning a point (a point designated from the instruction input unit 15) highlight-displayed on the screen of a three-dimensional display to be reversibly displayed in a shape-value information dialog, (Step ST540). Thereafter, to cause the information processor 1 to continue a display process (reversed-display) of other new coordinate values, a user inputs instruction information to continue a display process of a coordinate value dimension from the instruction input unit 15. The instruction information is transmitted from the instruction input unit 15 to the shape-value-information calculating unit 13.

The shape-value-information calculating unit 13 determines whether to continue the display process of coordinate values based on the instruction information from the instruction input unit 15 (Step ST550). When the shape-value-information calculating unit 13 determines to continue the display process of coordinate values (YES at Step ST550), the shapevalue-information calculating unit 13 causes the display unit 16 to cancel the highlight-display of the designated point highlight-displayed on the display screen of a three-dimensional shape (Step ST560). Further, the shape-value-information calculating unit 13 cancels the reversed-display on the shape-value information dialog of shape value information (a calculated value) concerning the designated point of which highlight-display is cancelled (Step ST565).

The shape-value-information calculating unit 13 performs the process of Steps ST520 to ST550. Thereafter, the shape-value-information calculating unit 13 repeats the process of Steps ST520 to ST565 until when a user inputs to the instruction input unit 15 instruction information (an end instruction) indicating not to perform a display process of other new coordinate values. When a user inputs the end instruction of the reversed-display to the instruction input unit 15 (NO at Step ST550), the information processor 1 does not perform new reversed-display.

(When Confirmation Type is Length Dimension or Angle Dimension)

When a confirmation type determined by the shape-value-information calculating unit 13 is a length dimension or an angle dimension (Step ST510; length dimension or angle dimension), shape value information is reversibly displayed in a shape-value information dialog. Further, two shape elements (shape elements used for calculating shape value information) relevant to the reversibly displayed shape value information are highlight-displayed on a display screen of a three-dimensional shape.

When a user designates by the instruction input unit 15 (a cursor movement by a mouse) shape value information displayed on the shape-value information dialog, the designated shape value information is input from the instruction input unit 15 to the shape-value-information calculating unit 13 (Step ST570).

The shape-value-information calculating unit 13 causes the shape value information (shape value information moved by a cursor) from the instruction input unit 15 to be reversibly displayed on the shape-value information dialog (Step ST580). The shape-value-information calculating unit 13 causes two shape elements relevant to the reversibly displayed shape value information to be highlight-displayed on the display screen of a three-dimensional shape (Step ST590).

Thereafter, to cause the information processor 1 to continue the display process (highlight-display) of another new length dimension or angle dimension, a user inputs instruction information indicating to continue the display process of a length dimension or an angle dimension from the instruction input unit 15. The instruction information is transmitted from the instruction input unit 15 to the shape-value-information calculating unit 13.

The shape-value-information calculating unit 13 determines whether to continue the display process of a length dimension or an angle dimension based on the instruction information from the instruction input unit 15 (Step ST600). When the shape-value-information calculating unit 13 determines to continue the display process of the length dimension or the angle dimension (YES at Step ST600), the shape-value-information calculating unit 13 causes the display unit 16 to cancel the reversed-display of the reversibly displayed shape value information on the shape-value information dialog (Step ST610). Further, the shape-value-information calculating unit 13 cancels the highlight-display on the display screen of a three-dimensional shape of each shape element corresponding to shape value information of which reversed-display is cancelled (Step ST620).

The shape-value-information calculating unit 13 performs the process of Steps ST570 to ST620. Thereafter, the shape-value-information calculating unit 13 repeats the process of Steps ST570 to ST620 until when a user inputs to the instruction input unit 15 instruction information (an end instruction) indicating not to perform a display process of another new length dimension or angle dimension. When the user inputs the end instruction of the highlight-display to the instruction input unit 15 (NO at Step ST600), the information processor 1 does not perform new highlight-display.

The shape-value-information calculating unit 13 can perform the process of Step ST560 and the process of Step ST565 in any order. That is, the shape-value-information calculating unit 13 can first perform any one of cancellation of highlight-display of a designated point and cancellation of reversed-display of shape value information.

The shape-value-information calculating unit 13 can perform the process of Step ST610 and the process of Step ST620 in any order. That is, the shape-value-information calculating unit 13 can first perform any one of cancellation of reversed-display of shape value information and cancellation of highlight-display of each shape element.

Figure 13:
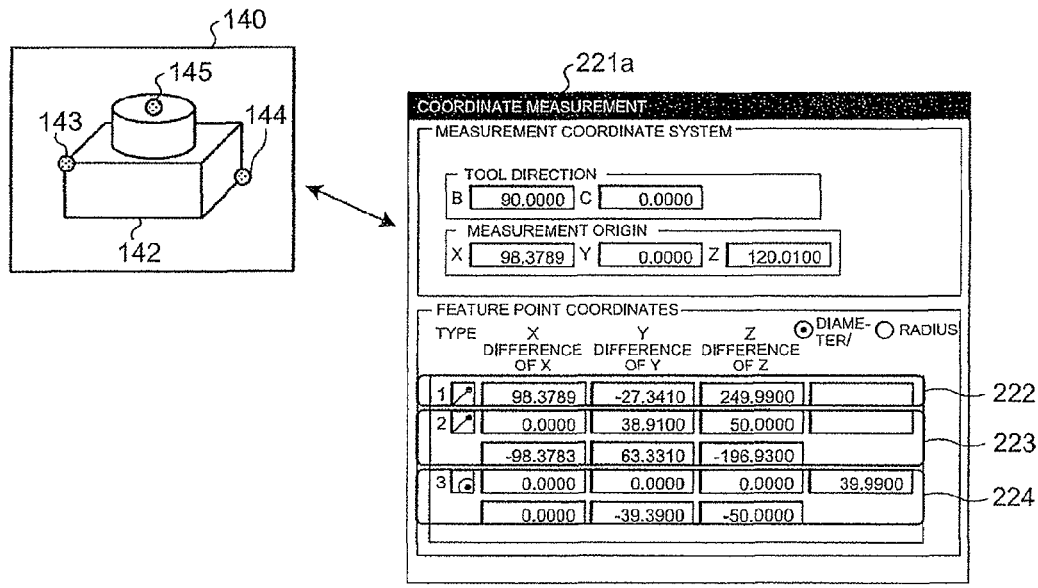
FIG. 13 is a display example (1) of a three-dimensional display screen and a shape-value information dialog.
Figure 14:
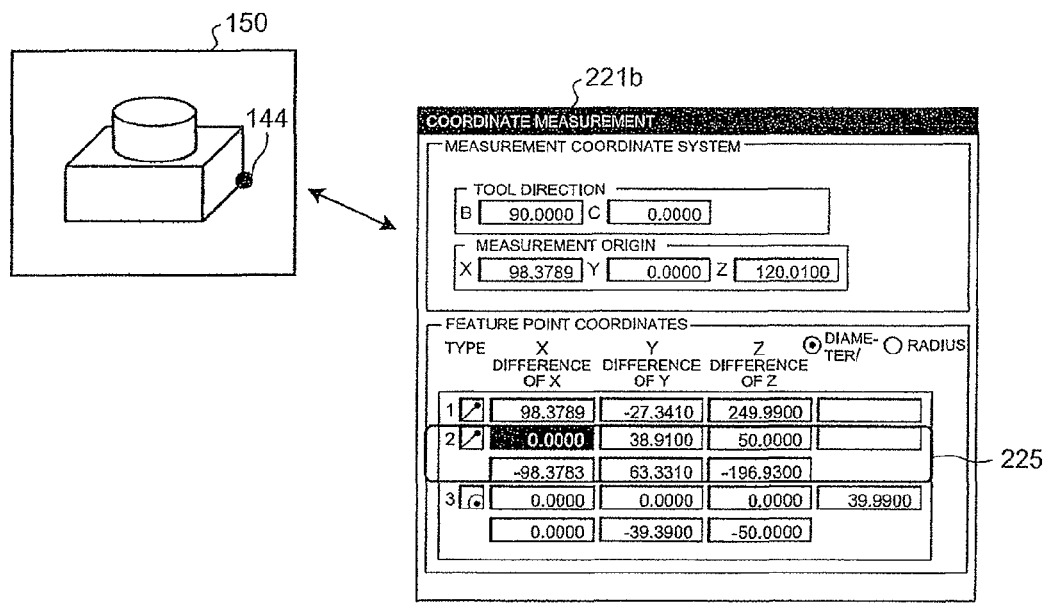
FIG. 14 is a display example (2) of a three-dimensional display screen and a shape-value information dialog.
Figure 15:
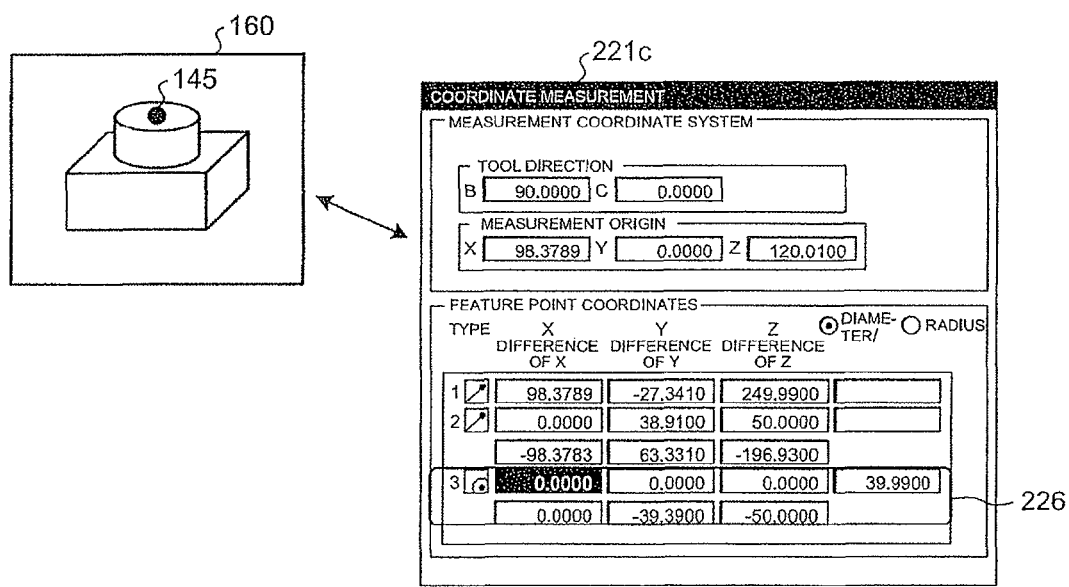
FIG. 15 is a display example (3) of a three-dimensional display screen and a shape-value information dialog.

A display example of a three-dimensional display screen and a display example of a shape-value information dialog are explained next. FIGS. 13 to 15 are display examples of a three-dimensional display screen and a shape-value information dialog. FIG. 13 depicts a display screen (a three-dimensional display screen 140) of a three-dimensional shape and a shape-value information dialog 221a when highlight-display of a shape element and reversed-display of shape value information are not performed.

The three-dimensional display screen 140 displays a three-dimensional shape 142, an ending point 143, an ending point 144, and a center point 145. The shape-value information dialog 221a displays shape value information 222 of the ending point 143, shape value information 223 of the ending point 144, and shape value information 224 of the center point 145.

FIG. 14 depicts a three-dimensional display screen 150 and a shape-value information dialog 221b when the ending point 144 is designated in a confirmation mode of shape value information. When the ending point 144 is designated, the designated ending point 144 is highlight-displayed on the three-dimensional display screen 150. Shape value information 225 of the ending point 144 is reversibly displayed in the shape-value information dialog 221b.

FIG. 15 depicts a three-dimensional display screen 160 and a shape-value information dialog 221c when the center point 145 is designated in the confirmation mode of shape value information. When the center point 145 is designated, the designated center point 145 is highlight-displayed on the three-dimensional display screen 160. Shape value information 226 of the center point 145 is reversibly displayed in the shape-value information dialog 221c.

Highlight-display of points and reversed-display of shape value information shown in FIGS. 13 to 15 are one example of a display method. A point and shape value information designated by a user and other points and other shape value information can be also displayed by any display method that a user can discriminate.

Figure 16:
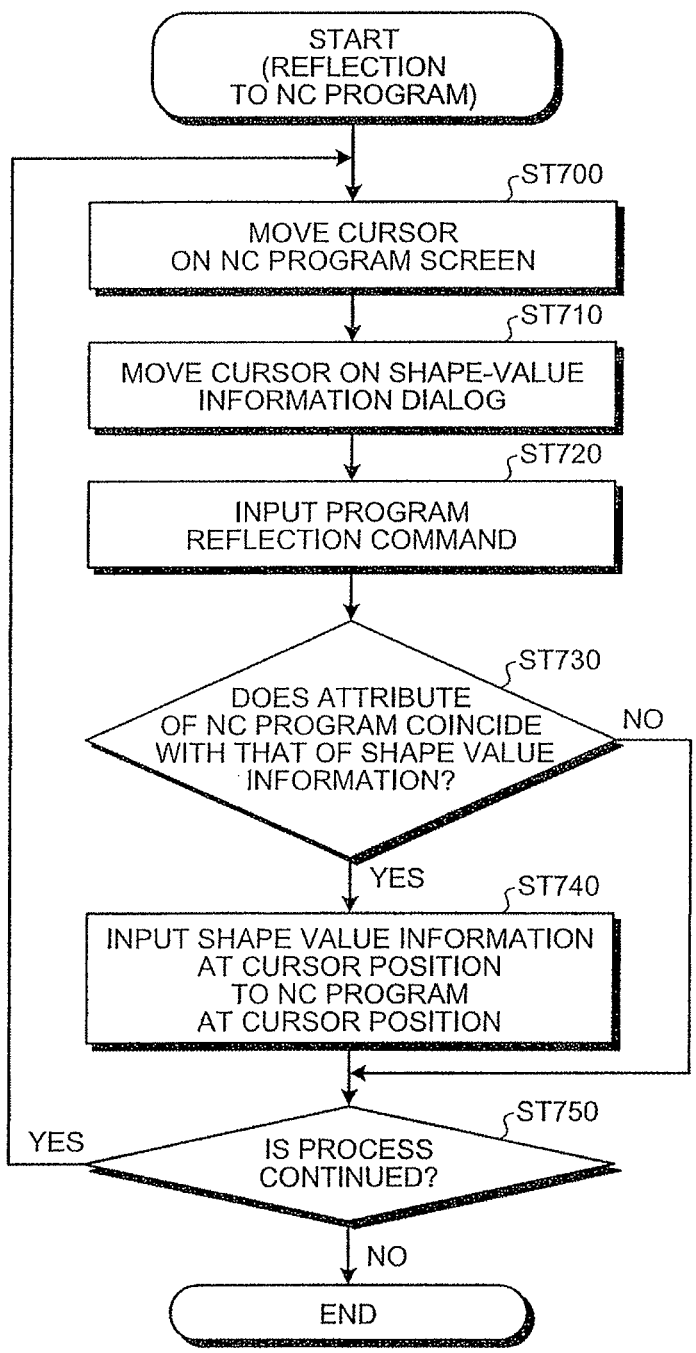
FIG. 16 is a flowchart of a reflection process procedure of shape value information to an NC program.

A process of Step ST70 (a reflection process to an NC program) is explained next. FIG. 16 is a flowchart of a reflection process procedure of shape value information to an NC program. When a reflection instruction of shape value information is input from the instruction input unit 15 to the NC program while the display unit 16 is displaying the shape value information in a shape-value information dialog, the reflection instruction is transmitted to the NC-program creating unit 2.

The NC-program reflecting unit 22 of the NC-program creating unit 2 extracts the NC program corresponding to the shape value information from the NC-program storage unit 21, and displays the extracted NC program on the display unit 16 as an NC program screen (an NC-program editor screen 301 described later).

When a user designates (designates to move a cursor) a position of an NC program to which shape value information is to be reflected on the NC program screen, the display unit 16 moves (displays) the cursor to the designated position on the NC program screen (Step ST700).

When the user designates (designates to move a cursor) a position of shape value information to be reflected on a shape-value information dialog, the display unit 16 moves (displays) the cursor to the designated position on the shape-value information dialog (Step ST710).

When the user inputs a command (a program reflection command) to reflect shape value information to an NC program, this command is input to the NC-program reflecting unit 22 (Step ST720).

The NC-program reflecting unit 22 compares an attribute of an NC program (data) at a position shown by the cursor on the NC program screen with an attribute of shape value information at a position shown by the cursor on the shape-value information dialog, and determines whether these attributes coincide with each other (Step ST730). The NC-program reflecting unit 22 determines whether the attributes of the data are the same process shape-value information such as whether both attributes are hole diameters, whether both attributes are hole depths, whether both attributes are surfaces or the like, and whether the attributes of data are coordinate values of (X, Y, and Z).

When the attribute of the NC program coincides with the attribute of the shape value information (YES at Step ST730), the NC-program reflecting unit 22 inputs (reflects) shape value information at a cursor position on the shape-value information dialog to the NC program at a cursor position on the NC program screen. Accordingly, the NC-program reflecting unit 22 updates the NC program in the NC-program storage unit 21 to a new NC program reflecting the shape value information (Step ST740).

On the other hand, when the attribute of the NC program does not coincide with the attribute of the shape value information (NO at Step ST730), the NC-program reflecting unit 22 does not set (does not reflect shape value information) data to the NC program.

Thereafter, to cause the information processor 1 to continue the reflection process to the NC program of shape value information, a user inputs to the instruction input unit 15 instruction information indicating to continue the reflection process of shape value information. The instruction information is transmitted from the instruction input unit 15 to the NC-program reflecting unit 22.

The NC-program reflecting unit 22 performs the process of Steps ST700 to ST750. Thereafter, the NC-program reflecting unit 22 repeats the process of Steps ST700 to ST750 until when a user inputs to the instruction input unit 15 instruction information (an end instruction) indicating not to continue the reflection process of shape value information. When the user inputs the end instruction of the reflection process of shape value information to the instruction input unit 15 (NO at Step ST750), the information processor 1 ends the reflection process of shape value information to the NC program.

Figure 17:
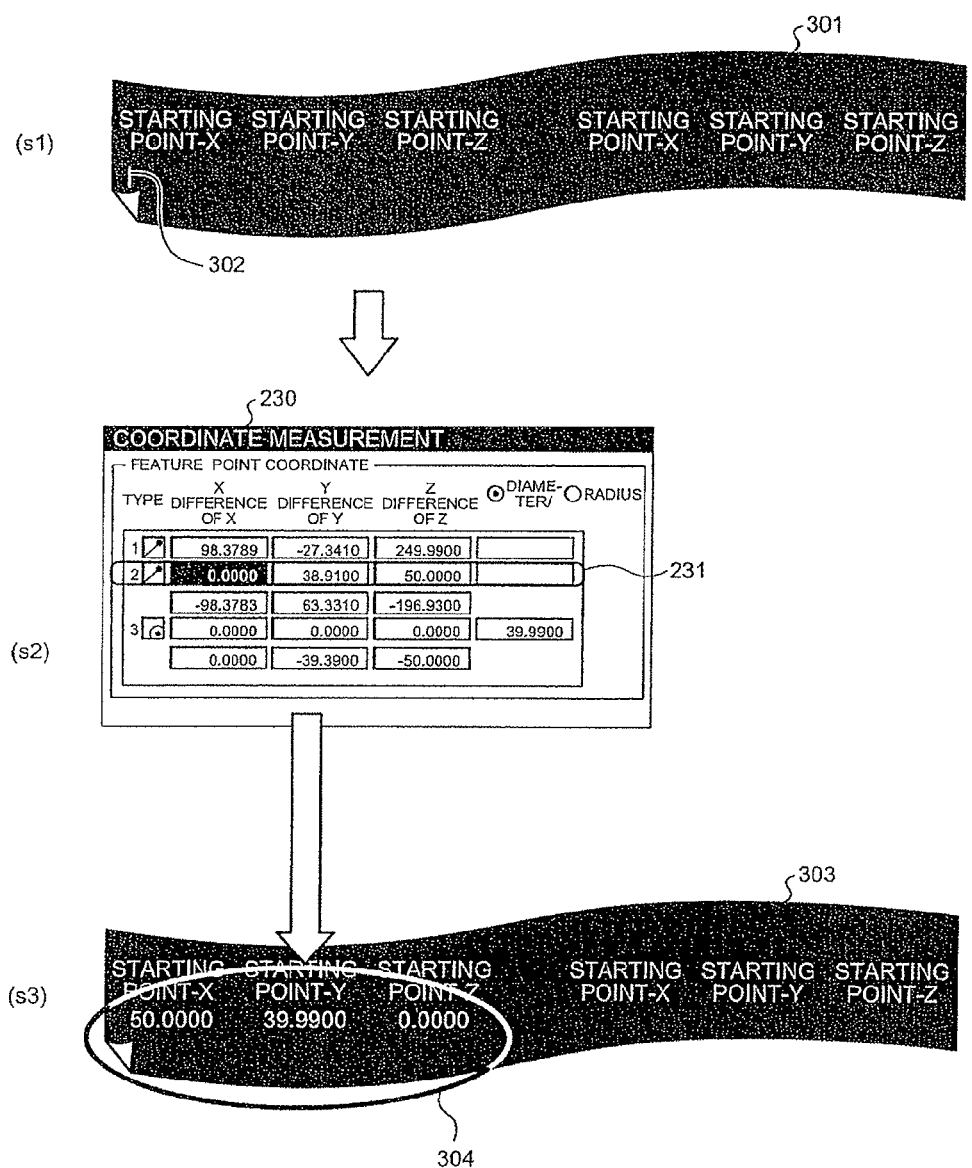
FIG. 17 is an explanatory diagram of a reflection process of shape value information to an NC program.

FIG. 17 is an explanatory diagram of a reflection process of shape value information to an NC program. To reflect shape value information to an NC program, a cursor 302 is moved to a position of the NC program to which the shape value information is to be reflected on the NC-program editor screen 301 (s1).

When the cursor is moved within the shape value information dialog 230 to a position of shape value information 231 to be reflected on the NC-program editor screen 301, the shape value information 231 is reversibly displayed (s2).

When a reflection button is clicked (when a program reflection command is input), information of the shape value information 231 is reflected on the NC-program editor screen 301, and shape value information 304 is displayed on an NC-program editor screen 303 after the reflection (s3).

Next, the calculation process of shape value information concerning a length dimension (Step ST260), the calculation process of shape value information concerning coordinate values (Step ST320), and the calculation process of shape value information concerning an angle dimension (Step ST410) explained with reference to FIG. 5 are explained in detail respectively.

Figure 18:
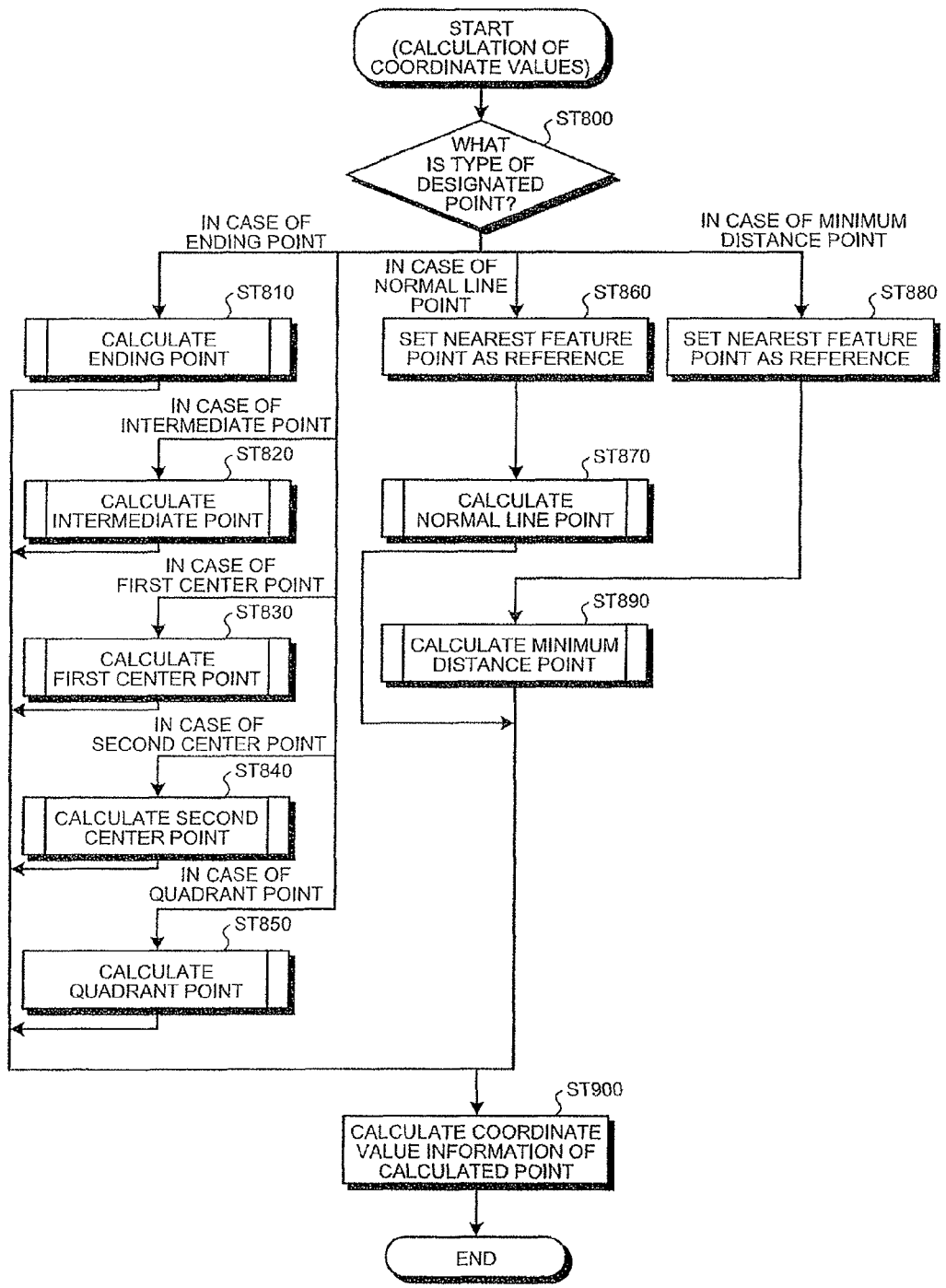
FIG. 18 is a flowchart of a calculation process procedure of shape value information concerning coordinate values.

FIG. 18 is a flowchart of a calculation process procedure of shape value information concerning coordinate values. The shape-value-information calculating unit 13 performs a calculation process of shape value information (coordinate values) corresponding to the type of a point (hereinafter, feature point) set in the process of Step ST290 in FIG. 5. First, the shape-value-information calculating unit 13 determines the type of a feature point (Step ST800). The type of a feature point includes an ending point, an intermediate point, a first center point, a second center point, a normal line point, a minimum distance point, and a quadrant point, for example.

The ending point is a starting point or an ending point of an edge when a shape element is an open edge. The intermediate point is a point at an intermediate between a starting point and an ending point of an edge when a shape element is an open edge. The first center point is a center point of an edge when a shape element is an arc edge. The second center point is a point corresponding to a most protruded position on a curved surface within a curved surface region before a hole is opened when a shape element is a curved surface having an open hole.

The normal line point is a point corresponding to a foot of a perpendicular line on a shape element from an optional point as a reference when a shape element is an edge or a surface. The minimum distance point is a point of a shortest distance on a shape element from an optional point as a reference when a shape element is an edge or a surface. The quadrant point is a point on a boundary of a region corresponding to each quadrant of an arc shape when a shape element is a surface containing an arc in a cross section such as an arc edge, a spherical surface, and a torus. Any point having a feature point other than these points and a point obtained by geometric calculation of a feature point can be also a calculation target of shape value information.

When the shape-value-information calculating unit 13 determines that the type of a feature point is "ending point" (Step ST800; edge), the shape-value-information calculating unit 13 calculates a position of the ending point (a starting point or an ending point of an edge) (Step ST810).

When the shape-value-information calculating unit 13 determines that the type of a feature point is "intermediate point" (Step ST800; intermediate point), the shape-value-information calculating unit 13 calculates a position of the intermediate point (Step ST820). Specifically, the shape-value-information calculating unit 13 obtains an interval value (an interval parameter from a starting point to an ending point) of a curve of an opened edge, and sets as an intermediate point a point at a position corresponding to an average value of the parameter. The intermediate point is a point at an intermediate position between ending points. When an edge is other than a straight-line edge or an arc edge, the intermediate point is not necessarily a point at an intermediate position of an edge length.

When the shape-value-information calculating unit 13 determines that the type of a feature point is "first center point" (Step ST800; first center point), the shape-value-information calculating unit 13 calculates a position of the first center point (Step ST830). Specifically, the shape-value-information calculating unit 13 sets as the first center point a point positioned at the center of an arc edge or a cylinder surface. In the case of a cylindrical surface or a conical surface, the shape-value-information calculating unit 13 obtains a point (an extremal point) on the cylindrical surface or the conical surface having a maximum value and a minimum value in a center axis direction on the cylindrical surface or the conical surface, and sets as the first center point a foot of a perpendicular line on a center axis from the extremal point.

When the shape-value-information calculating unit 13 determines that the type of a feature point is "second center point" (Step ST800; second center point), the shape-value-information calculating unit 13 calculates a position of the second center point (Step ST840). Specifically, when a peripheral surface of a hole on a cylindrical surface or a conical surface is a spherical surface, a torus, or a conical surface, the shape-value-information calculating unit 13 sets as the second center point an extremal point of the peripheral surface of the hole on a center axis of the hole (a cylindrical surface or a conical surface). In this case, the second center point is at the most protruded position within a curved surface region before the hole is opened in an original cylinder surface.

Such a point corresponds to a process starting point, for example. Therefore, when performing a process by a machining tool or the like, a process operator needs to recognize beforehand a point positioned at a process starting point or a process start target.

Conventionally, a process starting point is obtained from information of a material shape and a product shape. However, a process starting point is included in many cases in a region removed by the process, and a material shape and a product shape do not directly have information of a process starting point. Therefore, an operation of designating a process starting point is conventionally difficult. In the present embodiment, because the shape-value-information calculating unit 13 calculates a process starting point (a second center point), the process can be easily started.

When the shape-value-information calculating unit 13 determines that the type of a feature point is "quadrant point" (Step ST800; quadrant point), the shape-value-information calculating unit 13 calculates a position of the quadrant point (Step ST850). Specifically, the shape-value-information calculating unit 13 sets as the quadrant point a point positioned at 0°, 90°, 180°, and 270° of a measurement coordinate system, in an arc edge, a spherical surface, and a torus.

For example, in the case of an arc edge, a point on an arc as a point within a plane in which an axis of a measurement coordinate system becomes a normal line becomes a quadrant point. In the case of a spherical surface, a quadrant point of an arc (an arc edge) formed by intersection between a plane in which an axis of a measurement coordinate system becomes a normal surface as a plane passing the center of a sphere and the spherical surface becomes a quadrant point of the sphere. In the case of a torus, when a center axis of the torus coincides with a measurement coordinate system, a point positioned at 0°, 90°, 180°, and 270° of a cut surface (an arc) when the torus is cut by a coordinate axis surface containing the center axis becomes the quadrant point. That is, there are 16 quadrant points as a maximum on the torus.

When the shape-value-information calculating unit 13 determines that the type of a feature point is "normal line point" (Step ST800; normal line point), the shape-value-information calculating unit 13 calculates a position of the normal line point based on a nearest obtained feature point (a feature point designated by a user) (Steps ST800 and ST870). Specifically, the shape-value-information calculating unit 13 sets as the normal line point a point positioned (a shortest distance) at a foot of a perpendicular line on a center axis of an edge (a straight line or an arc), a plane, or a cylindrical surface from a feature point designated last time (a point designated immediately before a shape element that becomes a calculation target this time). The normal line point can be at the outside of a region of a shape element (a selection component) used for calculation. When a shape element used for calculation is an arc edge, it is sufficient that the last feature point and the arc edge are present within the same plane.

When the shape-value-information calculating unit 13 determines that the type of a feature point is "minimum distance point" (Step ST800; minimum distance point), the shape-value-information calculating unit 13 calculates a position of the minimum distance point based on a nearest obtained feature point (Steps ST880 and ST890). Specifically, the shape-value-information calculating unit 13 sets as the nearest distance point a vertex from which a distance to an edge (a straight line or an arc) and an optional surface is shortest, from a feature point designated last time.

The shape-value-information calculating unit 13 calculates a position of a feature point in the process of one of Steps ST810 to ST890, and calculates information (coordinate values, or a diameter or a radius in the case of an arc edge) concerning calculated coordinates of the feature point (Step ST900).

Figure 19:
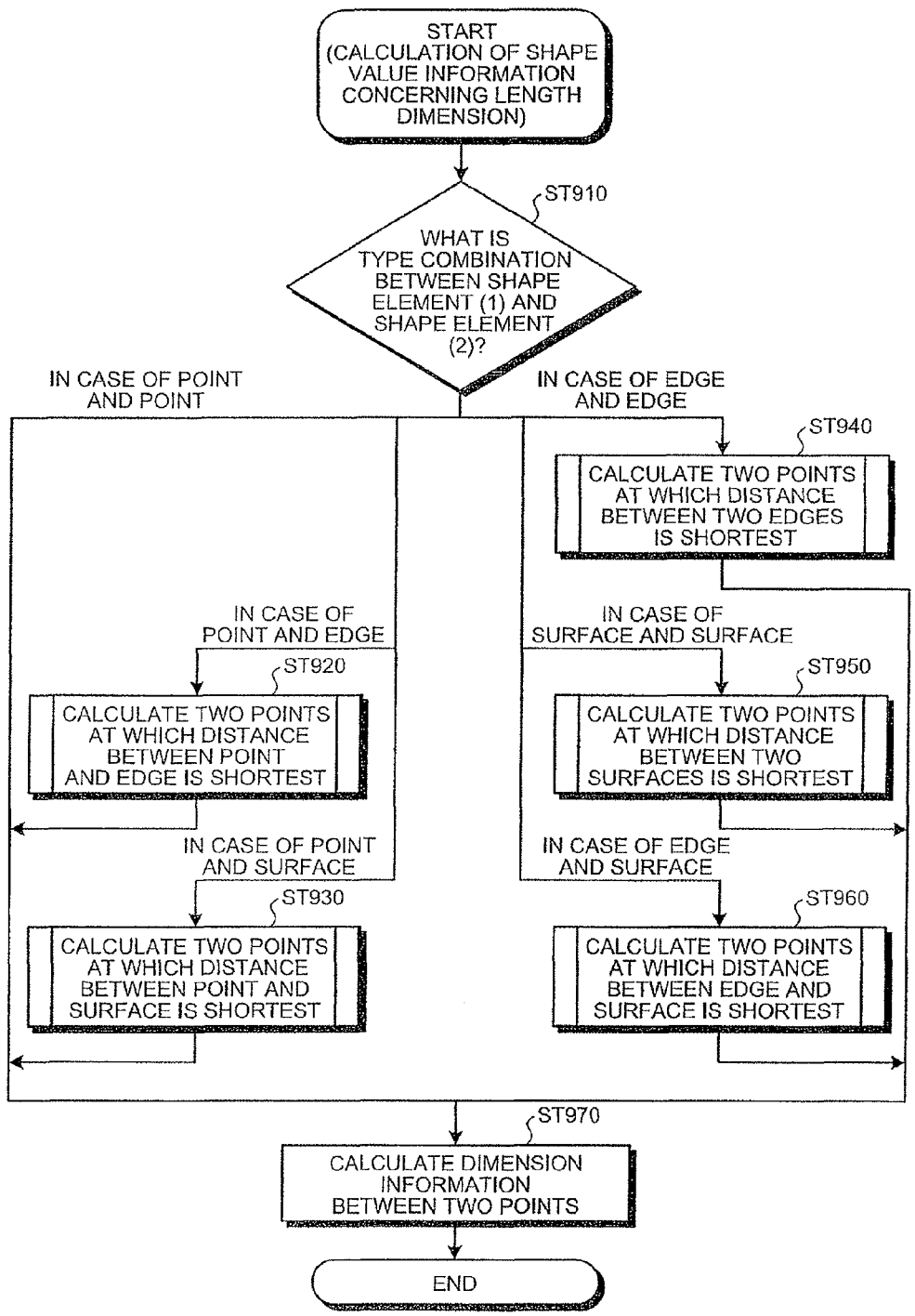
FIG. 19 is a flowchart of a calculation process procedure of shape value information concerning a length dimension.

FIG. 19 is a flowchart of a calculation process procedure of shape value information concerning a length dimension. The shape-value-information calculating unit 13 performs a calculation process of shape value information corresponding to the type of a combination of the shape element (1) set in the process of Step ST220 and the shape element (2) set in the process of Step ST240 in FIG. 5. First, the shape-value-information calculating unit 13 determines the type of the combination of the shape element (1) and the shape element (2) (Step ST910). When shape value information to be calculated is a length dimension, a combination of shape elements includes a point and a point, a point and an edge, a point and a surface, an edge and an edge, a surface and a surface, and an edge and a surface, for example.

In the present embodiment, irrespective of the order of setting the shape element (1) and the shape element (2), a calculation method of shape value information is divided depending on a case based on the type of a combination of the shape elements (1) and (2). Examples of a combination of the shape element (1) and (2) are explained below.

When the shape-value-information calculating unit 13 determines that a combination of shape elements is "a point and an edge" (Step ST910; point and edge), the shape-value-information calculating unit 13 calculates a point on an edge at which a distance between the point and the edge is shortest (Step ST920). The shape-value-information calculating unit 13 calculates a dimension (such as a dimension in XYZ coordinates and a dimension in XY coordinates) between calculated two points (Step ST970).

Figure 20:
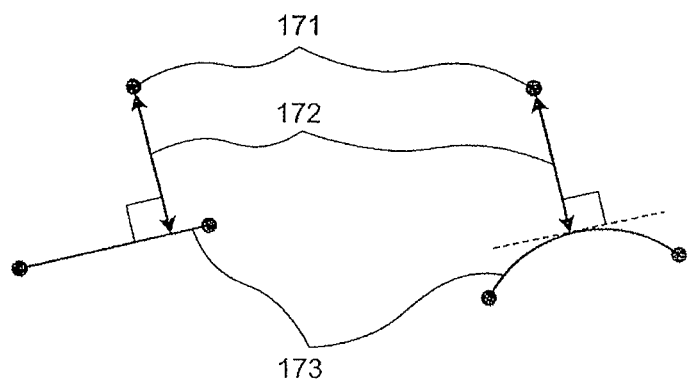
FIG. 20 is an explanatory diagram (1) of a shortest distance between a point and an edge.
Figure 21:
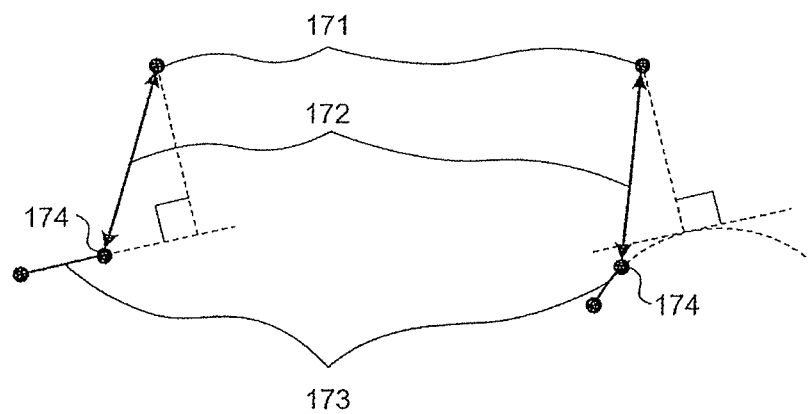
FIG. 21 is an explanatory diagram (2) of a shortest distance between a point and an edge.

FIGS. 20 and 21 are explanatory diagrams of a shortest distance between a point and an edge. As shown in FIG. 20, when a perpendicular line is extended from a point 171 to an edge 173, a foot of the perpendicular line is present on the edge 173. In this case, a length (a dimension 172) of the perpendicular line from the point 171 to the edge 173 is set as a dimension between two points. As shown in FIG. 21, when a perpendicular line is extended from the point 171 to the edge 173, that is, when a foot of the perpendicular line is not present on the edge 173, a shortest distance (the dimension 172) between the point 171 and a point 174 present within a region of the edge 173 is set as a dimension between two points.

When the shape-value-information calculating unit 13 determines that a combination of shape elements is "a point and a surface" (Step ST910; point and surface), the shape-value-information calculating unit 13 calculates a point on a surface at which a distance between the point and the surface is shortest (Step ST930). The shape-value-information calculating unit 13 calculates a dimension between calculated two points (Step ST970).

Figure 22:
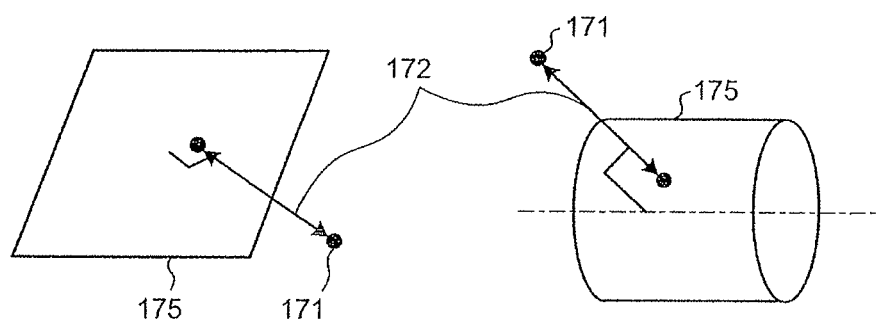
FIG. 22 is an explanatory diagram (1) of a shortest distance between a point and a surface.
Figure 23:
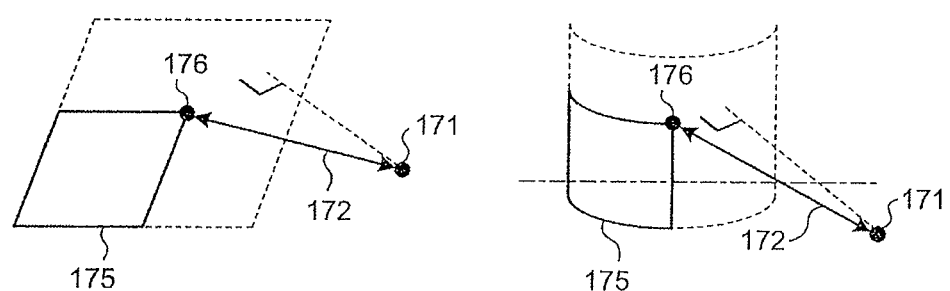
FIG. 23 is an explanatory diagram (2) of a shortest distance between a point and a surface.

FIGS. 22 and 23 are explanatory diagrams of a shortest distance between a point and a surface. As shown in FIG. 22, when a perpendicular line is extended from the point 171 to a surface 175, a foot of the perpendicular line is present on the surface 175. In this case, a length (the dimension 172) of the perpendicular line from the point 171 to the surface 175 is set as a dimension between two points. As shown in FIG. 23, when a perpendicular line is extended from the point 171 to the surface 175, a foot of the perpendicular line is not present on the surface 175. In this case, a shortest distance (the dimension 172) between the point 171 and a point 176 present within a region of the surface 175 is set as a dimension between two points.

When the shape-value-information calculating unit 13 determines that a combination of shape elements is "an edge and an edge" (Step ST910; edge and edge), the shape-value-information calculating unit 13 calculates a point on each edge at which a distance between the edge and the other edge is shortest (Step ST940). The shape-value-information calculating unit 13 calculates a dimension between calculated two points (Step ST970).

Figure 24:
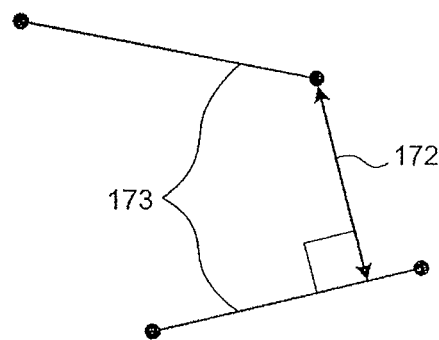
FIG. 24 is an explanatory diagram (1) of a shortest distance between an edge and an edge.
Figure 25:
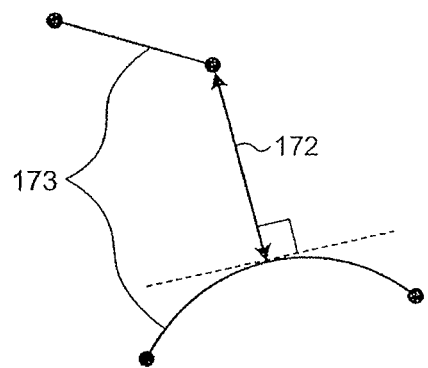
FIG. 25 is an explanatory diagram (2) of a shortest distance between an edge and an edge.

FIGS. 24 and 25 are explanatory diagrams of a shortest distance between an edge and an edge. As shown in FIGS. 24 and 25, when a perpendicular line is extended from one edge 173 to the other edge 173, a length (the dimension 172) of the perpendicular line from one edge 173 to the other edge 173 is set as a dimension between two points. FIG. 24 depicts the dimension 172 when the other edge 173 contains a line component, and FIG. 25 depicts the dimension 172 when the other edge 173 contains a curved line.

When the shape-value-information calculating unit 13 determines that a combination of shape elements is "a surface and a surface" (Step ST910; surface and surface), the shape-value-information calculating unit 13 calculates a point on each surface at which a distance between the surface and the surface (a distance between two surfaces) is shortest (Step ST950). The shape-value-information calculating unit 13 calculates a dimension between calculated two points (Step ST970).

Figure 26:
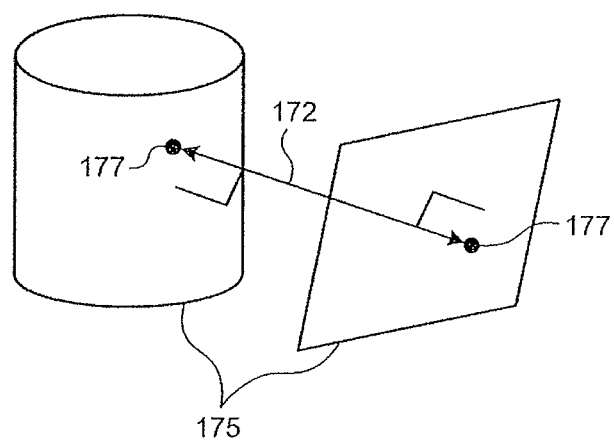
FIG. 26 is an explanatory diagram (1) of a shortest distance between a surface and a surface.
Figure 27:
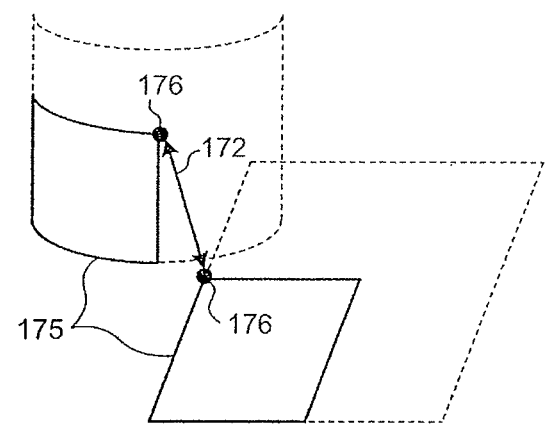
FIG. 27 is an explanatory diagram (2) of a shortest distance between a surface and a surface.

FIGS. 26 and 27 are explanatory diagrams of a shortest distance between a surface and a surface. As shown in FIG. 26, a straight line connecting between a point 177 on one surface 175 and the point 177 on other surface 175 becomes a perpendicular line to the one surface 175 and also becomes a perpendicular line to the other surface 175 (becomes a perpendicular line to both surfaces 175). In this case, a length of the perpendicular line (the dimension 172 between the point 177 on the one surface 175 and the point 177 on the other surface 175) is set as a dimension between two points. As shown in FIG. 27, when a perpendicular line is extended from one surface 175 to the other surface 175, a foot of the perpendicular line is not present on the other surface 175. In this case, a shortest distance (the dimension 172) between the point 177 on the one surface 175 and the point 176 present within a region of the other surface 175 is set as a dimension between two points.

When the shape-value-information calculating unit 13 determines that a combination of shape elements is "an edge and a surface" (Step ST910; edge and surface), the shape-value-information calculating unit 13 calculates a point on the edge and a point on the surface at which a distance between the edge and the surface is shortest (Step ST960). The shape-value-information calculating unit 13 calculates a dimension between calculated two points (Step ST970).

Figure 28:
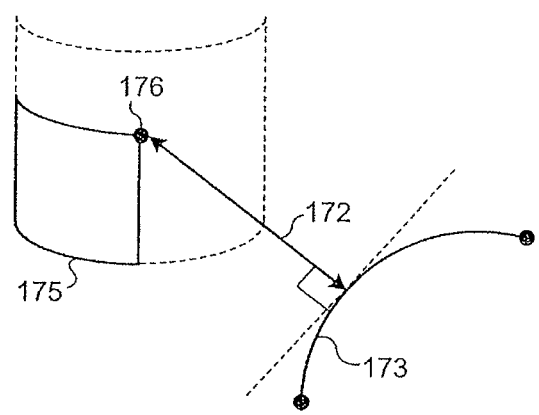
FIG. 28 is an explanatory diagram of a shortest distance between an edge and a surface.

FIG. 28 is an explanatory diagram of a shortest distance between an edge and a surface. As shown in FIG. 28, a length (the dimension 172) of a perpendicular line connecting between the point 176 present within a region of the surface 175 and the edge 173, when the perpendicular line is extended from the point 176 to the edge 173, is set as a dimension between two points.

When the shape-value-information calculating unit 13 determines that a combination of shape elements is "a point and a point" (Step ST910; point and point), the shape-value-information calculating unit 13 calculates a dimension between two points of the shape element (1) and the shape element (2) (Step ST970).

Figure 29:
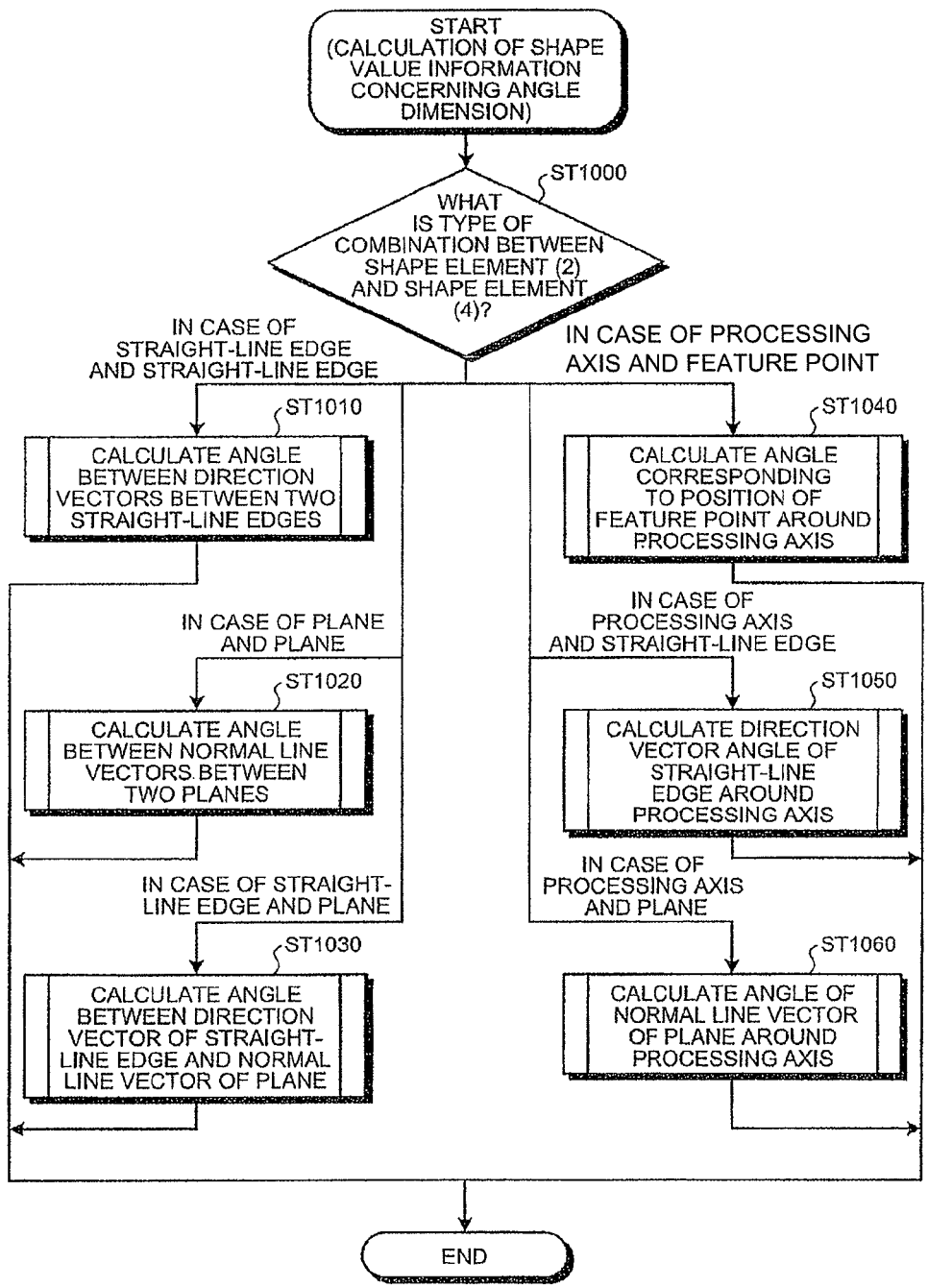
FIG. 29 is a flowchart of a calculation process procedure of shape value information concerning an angle dimension.

FIG. 29 is a flowchart of a calculation process procedure of shape value information concerning an angle dimension. The shape-value-information calculating unit 13 performs a calculation process of shape value information corresponding to the type of a combination of the shape element (3) set in the process of Step ST370 and the shape element (4) set in the process of Step ST390 in FIG. 5. First, the shape-value-information calculating unit 13 determines the type of the combination of the shape element (3) and the shape element (4) (Step ST1000).

When shape value information is an angle dimension, a combination of shape elements that can be set by the shape element (3) and the shape element (4) includes a straight-line edge and a straight-line edge, a plane and a plane, a straight-line edge and a plane, and a coordinate axis and a feature point, for example.

Therefore, when shape value information to be calculated is an angle dimension, a combination of shape elements includes a straight-line edge and a straight-line edge, a plane and a plane, a straight-line edge and a plane, a processing axis and a feature point, a processing axis and a straight-line edge, and a processing axis and a plane, for example.

In the present embodiment, irrespective of the order of setting the shape element (3) and the shape element (4), a calculation method of shape value information is divided depending on a case based on the type of a combination of the shape elements (3) and (4). Examples of a combination of the shape element (3) and the shape element (4) are explained below.

Figure 30:
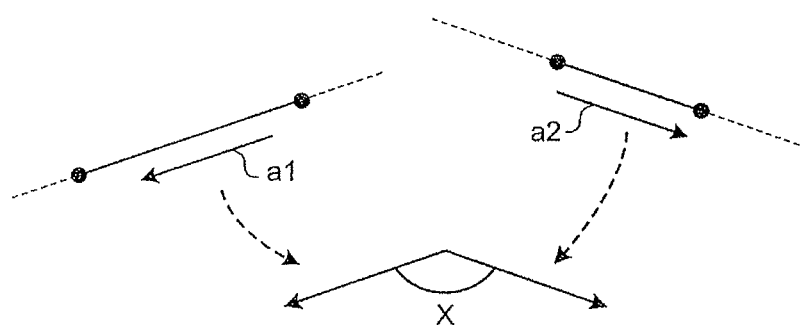
FIG. 30 depicts an angle formed by a direction vector of a straight-line edge and a direction vector of a straight-line edge.

When the shape-value-information calculating unit 13 determines that a combination of shape elements is "a straight-line edge and a straight-line edge" (Step ST1000; straight-line edge and straight-line edge), the shape-value-information calculating unit 13 obtains direction vectors of two straight-line edges, and calculates an angle between the obtained vectors (Step ST1010). As shown in FIG. 30, the shape-value-information calculating unit 13 sets an angle X formed by a direction vector a1 of a straight-line edge and a direction vector a2 of a straight-line edge as an angle between two components (a straight-line edge and a straight-line edge).

Figure 31:
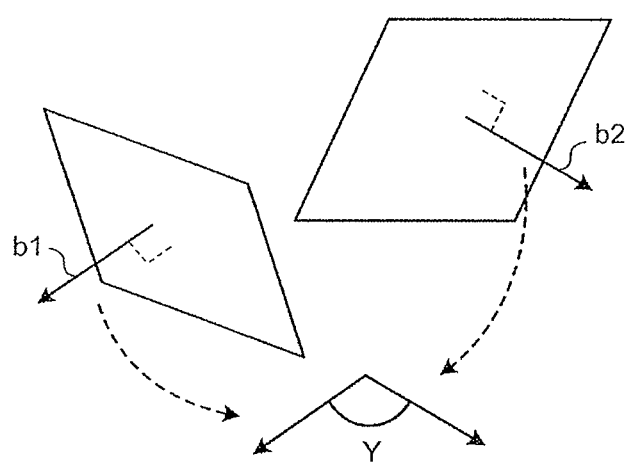
FIG. 31 depicts an angle formed by a normal line vector of a plane and a normal line vector of a plane.

When the shape-value-information calculating unit 13 determines that a combination of shape elements is "a plane and a plane" (Step ST1000; plane and plane), the shape-value-information calculating unit 13 obtains normal line vectors of two planes, and calculates an angle between the obtained vectors (Step ST1020). As shown in FIG. 31, the shape-value-information calculating unit 13 sets an angle Y formed by a normal line vector b1 of a plane and a normal line vector b2 of a plane as an angle between two components (a plane and a plane).

When the shape-value-information calculating unit 13 determines that a combination of shape elements is "a straight-line edge and a plane" (Step ST1000; straight-line edge and plane), the shape-value-information calculating unit 13 obtains a direction vector of the straight-line edge and a normal line vector of the plane, and calculates an angle between the obtained vectors (Step ST1030). As shown in FIGS. 32 and 33, the shape-value-information calculating unit 13 sets angles Z1 and Z2 between a direction vector a3 of a straight-line edge and a normal line vector b3 of a plane as angles between two components (a straight-line edge and a plane).

As shown in FIG. 32, when an angle $\alpha$ formed by the direction vector a3 of the straight-line edge and the normal line vector b3 of the plane is $0° \le \alpha 90°$, the angle Z1 obtained is $Z1=90°-\alpha$. On the other hand, as shown in FIG. 33, when an angle $\alpha$ formed by the direction vector a3 of the straight-line edge and the normal line vector b3 of the plane is $90° \le \alpha \le 180°$, the angle Z2 obtained is $Z2=\alpha-90°$.

When the shape-value-information calculating unit 13 determines that a combination of shape elements is "a processing axis and a feature point" (Step ST1000; processing axis and feature point), the shape-value-information calculating unit 13 calculates an angle corresponding to a position of the feature point around the processing axis (Step ST1040). For example, when a C-axis is selected, an angle formed by a straight line connecting between the origin and the feature point and an A-axis (a plus direction) is the angle obtained.

When the shape-value-information calculating unit 13 determines that a combination of shape elements is "a processing axis and a straight-line edge" (Step ST1000; processing axis and straight-line edge), the shape-value-information calculating unit 13 calculates an angle of a direction vector of the straight-line edge around the processing axis (Step ST1050). For example, when the C-axis is selected, an angle formed by the direction vector of the straight-line edge and the A-axis (a plus direction) is the angle obtained.

When the shape-value-information calculating unit 13 determines that a combination of shape elements is "a processing axis and a plane" (Step ST1000; processing axis and plane), the shape-value-information calculating unit 13 calculates an angle of a normal line vector of the plane around the processing axis (Step ST1060). For example, when the C-axis is selected, an angle formed by the normal line vector of the plane and the A-axis (a plus direction) is the angle obtained.

Based on an instruction input by a user to the instruction input unit 15, shape value information calculated by the shape-value-information calculating unit 13 and an NC program created by the NC-program reflecting unit 22 are output from the output unit 14 to an external device.

In the present embodiment, while the information processor includes the display unit 16, the information processor 1 and the display unit 16 can be separate configurations. Although the information processor 1 includes the NC-program creating unit 2, the information processor 1 and the NC-program creating unit 2 can be separate configurations. Although the information processor 1 includes the NC-program storage unit 21, the information processor 1 and the NC-program storage unit 21 can be separate configurations.

As explained above, according to the present embodiment, a user can easily obtain shape value information of coordinate values, a dimension value, and an angle value, without calculating these pieces of information. Because information (a length dimension and an angle dimension) of a shape registered in advance is not read but desired shape value information is calculated from geometric information of a three-dimensional shape, optional shape value information can be obtained. In obtaining shape value information, a shape-value information value based on a coordinate system set by a user can be calculated.

Because shape value information in a coordinate system set by a user can be calculated, calculation errors of a coordinate conversion calculation by a user can be reduced. Further, because obtained shape value information can be directly used in an NC program, input errors in creating an NC program can be reduced, and creation and editing of an NC program can be performed easily.

Because a three-dimensional display screen and a display format (a shape-value information dialog) displaying obtained shape value information can be displayed linked to each other, a user can easily confirm correspondence of shape value information to any portion within a three-dimensional shape.

Because obtained shape value information can be displayed in a display format corresponding to the type of an NC program, a user does not need to calculate shape value information to match a desired program-display format, thereby reducing calculation errors. Further, because shape value information displayed corresponding to a program display format can be directly used in an NC program, input errors in creating an NC program can be reduced, and creation and editing of an NC program can be performed easily.

INDUSTRIAL APPLICABILITY

As described above, the information processor and the information processing method according to the present invention are suitable to calculate information concerning a three-dimensional shape.

The invention claimed is:
1. An information processor that calculates information concerning a three-dimensional shape, comprising:
a three-dimensional-shape input unit configured to input drawing data of a three-dimensional shape;
a display unit configured to display a three-dimensional shape based on the input drawing data; and
a shape-value-information calculating unit configured to (a) set a shape element corresponding to an instruction input from outside from among shape elements of the displayed three-dimensional shape, to data used for calculating the displayed three-dimensional shape, (b) configured to calculate a dimension within the displayed three-dimensional shape as shape value information by using the set shape element, and (c) configured to instruct the display unit to display a calculation result, wherein
the instruction input from outside is an instruction to designate two different shape elements for which the dimension between the two different shape elements, is not clearly shown within the drawing data, wherein the dimension is a line or an angle not visible on a display that is formed between the two different shape elements visible on the display, and the shape-value-information calculating unit is further configured to calculate the shape value information by determining a type of elements combination formed by the two different elements from among a plurality of type of elements combinations and calculating a value for the dimension between the two different shape elements based on the determined type.

2. The information processor according to claim 1, further comprising a coordinate-system setting unit that sets a new coordinate system to a three-dimensional shape displayed on the display unit, based on an instruction input from outside, wherein the shape-value-information calculating unit converts data of the three-dimensional shape to data of a three-dimensional shape corresponding to a new coordinate system set by the coordinate-system setting unit, and calculates the shape value information by using converted data of the three-dimensional shape.

3. The information processor according to claim 1, further comprising an NC-program reflecting unit that reflects shape value information calculated by the shape-value-information calculating unit to an NC program corresponding to the drawing data, wherein the NC-program reflecting unit reflects calculated shape value information to an NC program, when the shape-value-information calculating unit calculates the shape value information, and the display unit displays an NC program to which the NC-program reflecting unit reflects the shape value information.

4. The information processor according to claim 3, wherein the display unit displays the shape value information in a programming method corresponding to the NC program.

5. The information processor according to claim 1, wherein the two different shape elements comprise two of a point, an edge, and a surface.

6. The information processor according to claim 1, wherein the plurality of type of elements combinations comprise a first element combination in which a first element of the two different shape elements is a point and a second element of the two different shape elements is one of an edge and a surface, a second element combination in which the first element of the two different shape elements is an edge and the second element of the two different shape elements is one of another edge and a surface, and a third element combination in which the first element of the two different shape elements is a surface and the second element is another surface.

7. The information processor according to claim 1, wherein the shape-value-information calculating unit is further configured to determine a category of the dimension from at least two types of dimensions to calculate, wherein the at least two categories of dimensions to calculate comprise a length dimension and an angle dimension.

8. An information processing method for calculating information concerning a three-dimensional shape, the method comprising:

inputting drawing data of a three-dimensional shape;

displaying the three-dimensional shape based on the input drawing data;

setting a shape element corresponding to an instruction input from outside from among displayed shape elements of the displayed three-dimensional shape;

calculating a dimension within the displayed three-dimensional shape as shape value information by using the set shape element; and displaying a calculation result based on the calculating, wherein the instruction input from outside is an instruction to designate two different shape elements for which a dimension between the two different shape elements is not clearly shown within the drawing data, wherein the dimension is a line or an angle not visible on a display that is formed between the two different shape elements visible on the display, and the calculating the shape value information comprises determining a type of elements combination formed by the two different shape elements from among a plurality of type of elements combinations and calculating a value for the dimension between the two different shape elements based on the determined type.

9. The information processing method according to claim 8, wherein:

if the two different shape elements are determined to be the point and the edge, calculate two points at which a distance between point and the edge is shortest, if the two different shape elements are determined to be the point and the surface, calculate two points at which a distance between the point and the surface is shortest, if the two different shape elements are determined to be two edges, calculate two points at which a distance between the two edges is shortest, if the two different shape elements are determined to be the edge and the surface, calculate two points at which distance between the edge and the surface is the shortest, and if the two different shape elements are determined to be two surfaces, calculate two points at which a distance between the two surfaces is shortest.

10. The information processing method according to claim 9, wherein the shape-value-information calculating unit calculating of the dimension between the two different shape elements comprises the calculating of the two points and calculating a distance between the two calculated points.

* * * * *